(12) United States Patent
Hori

(10) Patent No.: US 9,166,539 B2
(45) Date of Patent: Oct. 20, 2015

(54) RF SIGNAL GENERATION CIRCUIT AND WIRELESS TRANSMITTER

(75) Inventor: Shinichi Hori, Tokyo (JP)

(73) Assignee: NEC CORPORATION, Tokyo (JP)

(*) Notice: Subject to any disclaimer, the term of this patent is extended or adjusted under 35 U.S.C. 154(b) by 232 days.

(21) Appl. No.: 13/517,147

(22) PCT Filed: Dec. 20, 2010

(86) PCT No.: PCT/JP2010/072895
§ 371 (c)(1),
(2), (4) Date: Jun. 19, 2012

(87) PCT Pub. No.: WO2011/078120
PCT Pub. Date: Jun. 30, 2011

(65) Prior Publication Data
US 2012/0262214 A1    Oct. 18, 2012

(30) Foreign Application Priority Data

Dec. 21, 2009  (JP) .................................. 2009-289772
Sep. 2, 2010   (JP) .................................. 2010-196787

(51) Int. Cl.
*H04L 27/00* (2006.01)
*H03F 3/217* (2006.01)
(Continued)

(52) U.S. Cl.
CPC .............. *H03F 3/217* (2013.01); *H03F 1/0205* (2013.01); *H03F 3/245* (2013.01); *H04B 1/04* (2013.01); *H03F 2200/331* (2013.01); *H04B 2001/045* (2013.01)

(58) Field of Classification Search
CPC ...... H04B 1/71637; H04B 14/04; H04B 3/32; H03C 3/40; H04L 25/4927; H04L 25/03343; H04L 27/00; H04L 27/04; H04L 27/34; H04L 27/362; H04L 27/0008; H04L 27/2647; H04N 1/719; H04N 5/4401
USPC .......... 375/256, 242, 285, 295, 300, 302, 315
See application file for complete search history.

(56) References Cited

U.S. PATENT DOCUMENTS 6,281,829 B1 *  8/2001  Amrany et al. ............... 341/155
7,518,441 B2    4/2009  Nesimoglu et al.
(Continued)

FOREIGN PATENT DOCUMENTS

CN    101361341 A    2/2009
CN    101416400 A    4/2009
(Continued)

OTHER PUBLICATIONS

Search Report dated Apr. 5, 2013 issued by the European Patent Office in corresponding European Patent Application No. 10839350.5.
(Continued)

*Primary Examiner* — Dac Ha
*Assistant Examiner* — Janice Tieu
(74) *Attorney, Agent, or Firm* — Sughrue Mion, PLLC

(57) ABSTRACT

A wireless transmitter includes an RF signal generation circuit, a driver amplifier, and a class-D amplifier. The RF signal generation circuit detects an amplitude signal and a phase signal based on a digital baseband signal subjected to orthogonal modulation, thus generating a pulse phase signal which is High in response to the phase ranging from 0° to 180° but is Low in response to the phase ranging from 180° to 360°. The amplitude signal is subjected to sigma-delta modulation in synchronism with the pulse phase signal and further mixed with the pulse phase signal, thus producing an RF pulse signal. The RF pulse signal is input to the class-D amplifier via the driver amplifier, thus outputting a pulse voltage signal based on a reference voltage. Thus, it is possible to achieve a small-size wireless transmitter with good noise/distortion characteristics and high power efficiency.

6 Claims, 17 Drawing Sheets

(51) Int. Cl.
*H03F 3/24* (2006.01)
*H04B 1/04* (2006.01)
*H03F 1/02* (2006.01)

(56) References Cited

U.S. PATENT DOCUMENTS

| | | |
|---|---|---|
| 2004/0036530 A1 | 2/2004 | Matsuura et al. |
| 2005/0002469 A1* | 1/2005 | Oberg et al. ................. 375/295 |
| 2005/0163253 A1 | 7/2005 | Matsuura et al. |
| 2005/0190671 A1* | 9/2005 | Chen et al. ................. 369/47.27 |
| 2007/0008199 A1* | 1/2007 | Rezeq et al. ................. 341/118 |
| 2007/0123184 A1 | 5/2007 | Nesimoglu et al. |
| 2007/0160164 A1* | 7/2007 | Sahota ........................ 375/295 |

FOREIGN PATENT DOCUMENTS

| | | |
|---|---|---|
| JP | 2004-48703 A | 2/2004 |
| JP | 2005-236968 A | 9/2005 |
| JP | 2009-517912 A | 4/2009 |
| JP | 2009-159343 A | 7/2009 |

OTHER PUBLICATIONS

Antoine Frappe et al., "A digital ΔΣ RF signal generator for mobile communication transmitters in 90nm CMOS", IEEE Radio Frequency Integrated Circuits Symposium, Jun. 2008, pp. 13-16.

International Search Report for PCT/JP2010/072895 dated Jan. 25, 2011.

Office Action, dated Feb. 8, 2014, issued by the State Intellectual Property Office, in counterpart Application No. 201080057929.8.

* cited by examiner

FIG. 15

| OUTPUT OF SIGMA-DELTA MODULATOR | A | B | C |
|---|---|---|---|
| 1 | H | L | L |
| 0 | L | H | L |
| -1 | L | L | H |

TRUTH TABLE A: USED IN CASE OF CONTROL SIGNAL X

| OUTPUT OF SIGMA-DELTA MODULATOR | A | B | C |
|---|---|---|---|
| 1 | H | L | L |
| 0 | L | H | L |
| -1 | L | L | H |

(a)

TRUTH TABLE B: USED IN CASE OF CONTROL SIGNAL Y

| OUTPUT OF SIGMA-DELTA MODULATOR | A | B | C |
|---|---|---|---|
| 1 | L | L | H |
| 0 | — | — | — |
| -1 | H | L | L |

(b)

RF SIGNAL GENERATION CIRCUIT AND WIRELESS TRANSMITTER

TECHNICAL FIELD

The present invention relates to a wireless transmitter which is installed in a communication device, such as a cellular phone and a wireless LAN, in order to wirelessly transmit a digital signal, and in particular to an RF signal generation circuit which generates an RF pulse signal based on a digital signal.

The present application claims priorities on Japanese Patent Application No. 2009-289772 (filing date: Dec. 21, 2009) and Japanese Patent Application No. 2010-196787 (filing date: Sep. 2, 2010), the entire contents of which are incorporated herein by reference.

BACKGROUND ART

A transmitter of a communication device, such as a cellular phone and a wireless LAN, is required to operate with low power consumption while securing the accuracy of transmitting signals irrespective of its output power. In particular, the power consumption of a power amplifier, which is arranged in the last stage of a communication device and which occupies 50% or more in the entire power consumption of a communication device, is required to operate at high power efficiency.

Recently, a switching amplifier has attracted attention as a power amplifier which is expected to demonstrate high power efficiency. A switching amplifier is assumed to receive a pulse waveform signal as its input signal, thus achieving power amplification with maintaining its waveform. A pulse waveform signal amplified by a switching amplifier is adequately suppressed in frequency components, other than a desired frequency component, with a filter element and subsequently emitted into the air via an antenna.

FIG. 19 is a circuit diagram showing a D-class amplifier 1 representative of a switching amplifier. The D-class amplifier 1 includes two switch elements 3a, 3b which are connected in series between a power source 2 and a ground GND. Complementary pulse signals S1, S2, serving as open/close control signals, are applied to the two switch elements 3a, 3b, thus solely turning on either the switch elements 3a, 3b. When the switch element 3a proximate to the power source 2 is turned on while the switch element 3b proximate to the ground GND is turned off, the D-class amplifier 1 outputs a voltage identical to a source voltage. In contrast, when the switch element 3a is turned off while the switch element 3b is turned on, the D-class amplifier 1 outputs a voltage identical to a ground potential.

Ideally, the D-class amplifier 1 causes zero power loss because it does not need a bias current. In this connection, the switch elements 3a, 3b may comprise field-effect transistors or bipolar transistors.

FIG. 20 is a block diagram showing the constitution of a wireless transmitter 5 using the D-class amplifier 1. This constitution is disclosed in NPL 1. In FIG. 20, the constituent parts identical to those shown in FIG. 19 are denoted using the same reference signs. The wireless transmitter 5 includes an RF signal generation circuit 6, a driver amplifier 7, and the D-class amplifier 1. In the case of the W-CDMA (Wideband Code Division Multiple Access) system, for example, a digital baseband 8 is able to generate a multi-bit wireless signal configured of ten bits or more.

The D-class amplifier 1 receives a pulse waveform signal as its input signal. An output signal of the digital baseband 8 needs to be converted into 1-bit information in advance because a pulse waveform signal is able to solely transmit one bit per one pulse. Sigma-delta modulators 9a, 9b are employed as a circuit configuration achieving one-bit information conversion in order to maintain a good noise characteristic in frequencies proximate to a frequency band of a desired wave. With this circuit configuration, it is possible to convert a wireless transmission signal into a pulse waveform signal while maintaining a good noise characteristic, thus inputting a pulse waveform signal into the D-class amplifier 1.

CITATION LIST

Non Patent Literature

NPL 1: A Frappe, B. Stefanelli, A. Flament, A. Kaiser and A. Cathelin, "A Digital ΔΣ RF Signal Generator For Mobile Communication Transmitters In 90 nm CMOS", in IEEE RFIC Symp. pp. 13-16, June 2008.

SUMMARY OF INVENTION

Technical Problem

The D-class amplifier 1 disclosed in NPL 1 cannot actually achieve high-efficiency inner conductor power amplification. The reasons will be described below.

Ideally, the switch elements 3a, 3b forming the D-class amplifier 1 exhibit zero impedance between their terminals when they are turned on but exhibit infinite impedance between their terminals when they are turned off. In the D-class amplifier 1 shown in FIG. 19, when the switches 3a, 3b are each inverted from the ON/OFF state, a voltage at the output terminal of the switch element 3b instantaneously decreases from the source voltage to the ground potential. Additionally, when the switch element 3b is turned on, a load is connected to the ground GND so that a current flows through the switch element 3b.

The switch element 3b causes thermal loss equivalent to the product of a voltage at its output terminal by a current flowing through the switch element 3b. Additionally, no thermal loss occurs when the switch element 3b is turned on, and therefore, the output voltage becomes the ground potential, i.e. zero. Moreover, no thermal loss occur when the switch element 3b is turned off and no current flows through the switch element 3b.

Therefore, the switch element 3b causes thermal loss during a process of transition from the ON state to the OFF state or from the OFF state to the ON state. For example, the thermal loss which occurs during a process of transition from the ON state to the OFF state is equivalent to the product (i.e. I-V overlap) of a voltage waveform, which is formed until a voltage at the output terminal of the switch element 3b decreases to the ground potential, and a waveform of a current flowing through the switch element 3b during the transition process. No thermal loss occurs in the ideal state of the switch element 3b because an approximately zero rise time is assumed to appear in the output terminal voltage, and therefore an approximately zero overlap component is assumed to appear between the voltage waveform and the current waveform.

Actually, in the D-class amplifier 1, the switch element 3a comprises a P-type FET while the switch element 3b comprises an N-type FET. The P-type FET is placed in the ON state causing a short-circuit between its drain and source when its gate receives a voltage sufficiently lower than a threshold, but the P-type FET is placed in the OFF state causing disengagement between its drain and source when its gate receives a voltage sufficiently higher than the threshold. The N-type FET is placed in the OFF state when its gate receives a voltage sufficiently lower than a threshold, but the N-type FET is placed in the ON state when its gate receives a voltage sufficiently higher than the threshold.

Due to parasitic parameters such as channel resistance and drain-source capacitance, an FET element undergoes drain-source impedance higher than zero in the ON state, but it undergoes finite capacitive impedance as its drain-source impedance in the OFF state.

Generally speaking, in a D-class amplifier configured of FET elements, when an upper P-type FET and a lower N-type FET are each inverted from the ON/OFF state, a drain voltage of the N-type FET may increase with obtuseness represented by an RC time constant depending on channel resistance and drain-source capacity. In the presence of obtuseness, the I-V overlap may increase so that thermal loss having a finite value occurs in an FET element.

The thermal loss of an FET element may significantly increase beyond its negligible level due to a high drain current continuously flowing until its drain voltage decreases to the ground potential. In the wireless transmitter 5 shown in FIG. 20, pulse waveform signals applied to the D-class amplifier 1 are clock synchronous pulse signals which are generated by the sigma-delta modulators 9a, 9b.

In contrast, the phase of a wireless signal, which is reproduced based on pulse signals, is irrelevant to clock signals of the sigma-delta modulators 9a, 9b. Considering that a drain current of an FET element has the same phase as a wireless signal, no correlation can be found between the phase of a drain voltage and the phase of a drain current. This indicates that a drain current increases at the rise start time of a drain voltage. That is, the D-class amplifier 1 increases its power consumption.

It is an object of the present invention to provide a small-size RF signal generation circuit with high power efficiency and with a good noise characteristic and a good distortion characteristic.

Additionally, it is another object of the present invention to provide a wireless transmitter using the RF signal generation circuit.

Solution to Problem

The present invention relates to an RF signal generation circuit adapted to wireless transmission of a digital signal, which includes an orthogonal modulator that performs orthogonal modulation on a digital signal; an amplitude detector that detects an amplitude of the output signal of the orthogonal modulator, thus outputting an amplitude signal; a phase detector that detects a phase of the output signal of the orthogonal modulator, thus outputting a phase signal; a pulse phase signal generator that generates a pulse phase signal having a pulse waveform based on the phase signal; a sigma-delta modulator that performs sigma-delta modulation on the amplitude signal in synchronism with the pulse phase signal; and a mixer that mixes the output signal of the sigma-delta modulator with the pulse phase signal, thus generating an RF pulse signal.

The present invention relates to an RF signal generation circuit adapted to wireless transmission of a digital signal, which includes an amplitude detector that detects an amplitude of a digital signal so as to output an amplitude signal; a phase detector that detects a phase of the digital signal so as to output a phase signal; a pulse phase signal generator that generates a pulse phase signal having a pulse waveform based on the phase signal; a sigma-delta modulator that performs sigma-delta modulation on the amplitude signal in synchronism with the pulse phase signal; and a mixer that mixes the output signal of the sigma-delta modulator with the pulse phase signal so as to generate an RF pulse signal.

The present invention relates to a wireless transmitter that wirelessly transmits a digital signal, which includes an amplitude detector that detects an amplitude of a digital signal so as to output an amplitude signal; a phase detector that detects a phase of the digital signal so as to output a phase signal; a pulse phase signal generator that generates a pulse phase signal having a pulse waveform based on the phase signal; a sigma-delta modulator that performs sigma-delta modulation on the amplitude signal in synchronism with the pulse phase signal; a mixer that mixes the output signal of the sigma-delta modulator with the pulse phase signal so as to generate an RF pulse signal; and an amplifier that converts a positive level of the RF pulse signal into a predetermined reference voltage value but converts a negative level of the RF pulse signal into a ground potential.

The present invention relates to an RF signal generation method adapted to wireless transmission of a digital signal, which implements the steps of performing orthogonal modulation on a digital signal; detecting an amplitude of the digital signal subjected to orthogonal modulation, thus outputting an amplitude signal; detecting a phase of the digital signal subjected to orthogonal modulation, thus outputting a phase signal; generating a pulse phase signal having a pulse waveform based on the phase signal; performing sigma-delta modulation on the amplitude signal in synchronism with the pulse phase signal; and mixing the amplitude signal subjected to sigma-delta modulation with the pulse phase signal, thus generating an RF pulse signal.

The present invention relates to an RF signal generation method adapted to wireless transmission of a digital signal, which implements the steps of: detecting an amplitude of the digital signal so as to output an amplitude signal; detecting a phase of the digital signal so as to output a phase signal; generating a pulse phase signal having a pulse waveform based on the phase signal; performing sigma-delta modulation on the amplitude signal in synchronism with the pulse phase signal; and mixing the amplitude signal subjected to sigma-delta modulation with the pulse phase signal, thus generating an RF pulse signal.

The present invention relates to a signal processing method adapted to wireless transmission of a digital signal, which implements the steps of: detecting an amplitude of the digital signal so as to output an amplitude signal; detecting a phase of the digital signal so as to output a phase signal; generating a pulse phase signal having a pulse waveform based on the phase signal; performing sigma-delta modulation on the amplitude signal in synchronism with the pulse phase signal; mixing the amplitude signal subjected to sigma-delta modulation with the pulse phase signal, thus generating an RF pulse signal; converting a positive level of the RF pulse signal into a reference voltage value; and converting a negative level of the RF pulse signal into a ground potential.

The present invention relates to a wireless transmitter that wirelessly transmits a digital signal, which includes: an amplitude detector that detects an amplitude of a digital signal so as to output an amplitude signal; a phase detector that detects a phase of the digital signal so as to output a phase signal; a pulse phase signal generator that generates a pulse phase signal having a pulse waveform based on the phase signal; a sigma-delta modulator that performs sigma-delta modulation on the amplitude signal in synchronism with the pulse phase signal; a mixer that mixes the output signal of the sigma-delta modulator with the pulse phase signal so as to generate an RF pulse signal; and an amplifier that converts the RF pulse signal into a predetermined reference voltage value based on the output value of the sigma-delta modulator.

Advantageous Effects of Invention

According to the present invention, it is possible to reduce an overlap of the current with the voltage between terminals due to an open/close operation of switch elements included in a D-class amplifier applied to a wireless transmitter, and therefore it is possible to reduce thermal loss that occurs in switch elements. Thus, it is possible to achieve a good noise characteristic, a good distortion characteristic, and high power efficiency with a D-class amplifier.

BRIEF DESCRIPTION OF DRAWINGS

FIG. 15 A truth table showing the operation of a decoder connected to the subsequent stage of the RF signal generation circuit shown in FIG. 12.

DESCRIPTION OF EMBODIMENTS

The present invention will be described in detail by way of examples with reference to the accompanying drawings. Herein, the same constituent elements are denoted using the same reference signs.

First Embodiment

Figure 1:
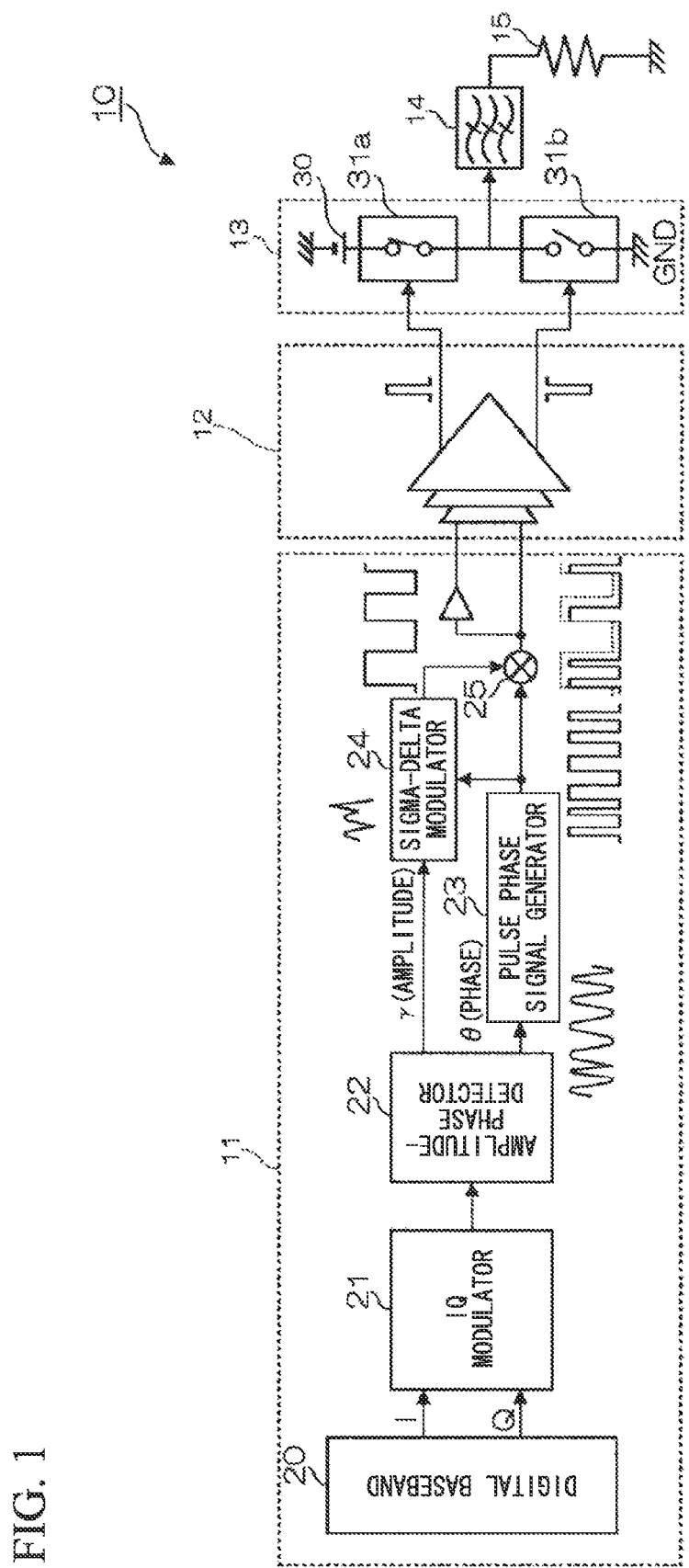
FIG. 1 A block diagram showing the constitution of a wireless transmitter according to a first embodiment of the present invention.

FIG. 1 is a block diagram showing the constitution of a wireless transmitter 10 according to a first embodiment of the present invention. The wireless transmitter 10 includes an RF signal generation circuit 11, a driver amplifier 12, and a D-class amplifier 13. The RF signal generation circuit 11 includes a digital baseband 20, an IQ modulator 21, an amplitude-phase detector 22, a pulse phase signal generator 23, a sigma-delta modulator 24, and a mixer 25.

The IQ modulator 21 converts an orthogonal wireless signal, generated by the digital baseband 20, into an RF signal. The amplitude-phase detector 22 divides an RF signal to extract an amplitude signal γ and a phase signal θ. The amplitude signal γ is supplied to the sigma-delta modulator 24 while the phase signal θ is supplied to the pulse phase signal generator 23.

The pulse phase signal generator 23 generates a pulse phase signal which is High when the phase signal θ lies between 0° and 180° but which is Low when the phase signal θ lies between 180° and 360°. The pulse phase signal is supplied to a clock terminal of the sigma-delta modulator 24 and the mixer 25. The leading edge of a pulse phase signal matches a phase signal θ at 0°, while the trailing edge thereof matches a phase signal θ at 180°. The sigma-delta modulator 24 receives a pulse phase signal as a clock signal and converts an amplitude signal γ into a pulse amplitude signal with a pulse waveform, which is subsequently supplied to the mixer 25. In this connection, a pulse rate of pulse amplitude signal is not constant but will be changing in synchronism with a pulse phase signal.

The mixer 25 outputs a low level when a pulse amplitude signal is Low but outputs a level identical to that of a pulse phase signal when the pulse amplitude signal is High. The D-class amplifier 13 includes two switch elements 31a, 31b which are connected in series between a power source 30 and a ground GND. The D-class amplifier 13 outputs a pulse voltage signal with the same waveform as a pulse waveform applied to the switch elements 31a, 31b.

The switch elements 31a, 31b of the class-D amplifier 13 are supplied with an output signal of the mixer 25 and its complementary signal via the driver amplifier 12. A filter circuit 14 is connected to the subsequent stage of the class-D amplifier 13, wherein it has a transmission band, identical to a frequency band of an RF signal, so as to selectively transmit an RF signal, included in a pulse voltage signal output from the class-D amplifier 13, therethrough. A load 15 is connected to the subsequent stage of the filter circuit 14 so as to reproduce an RF signal.

Figure 2:
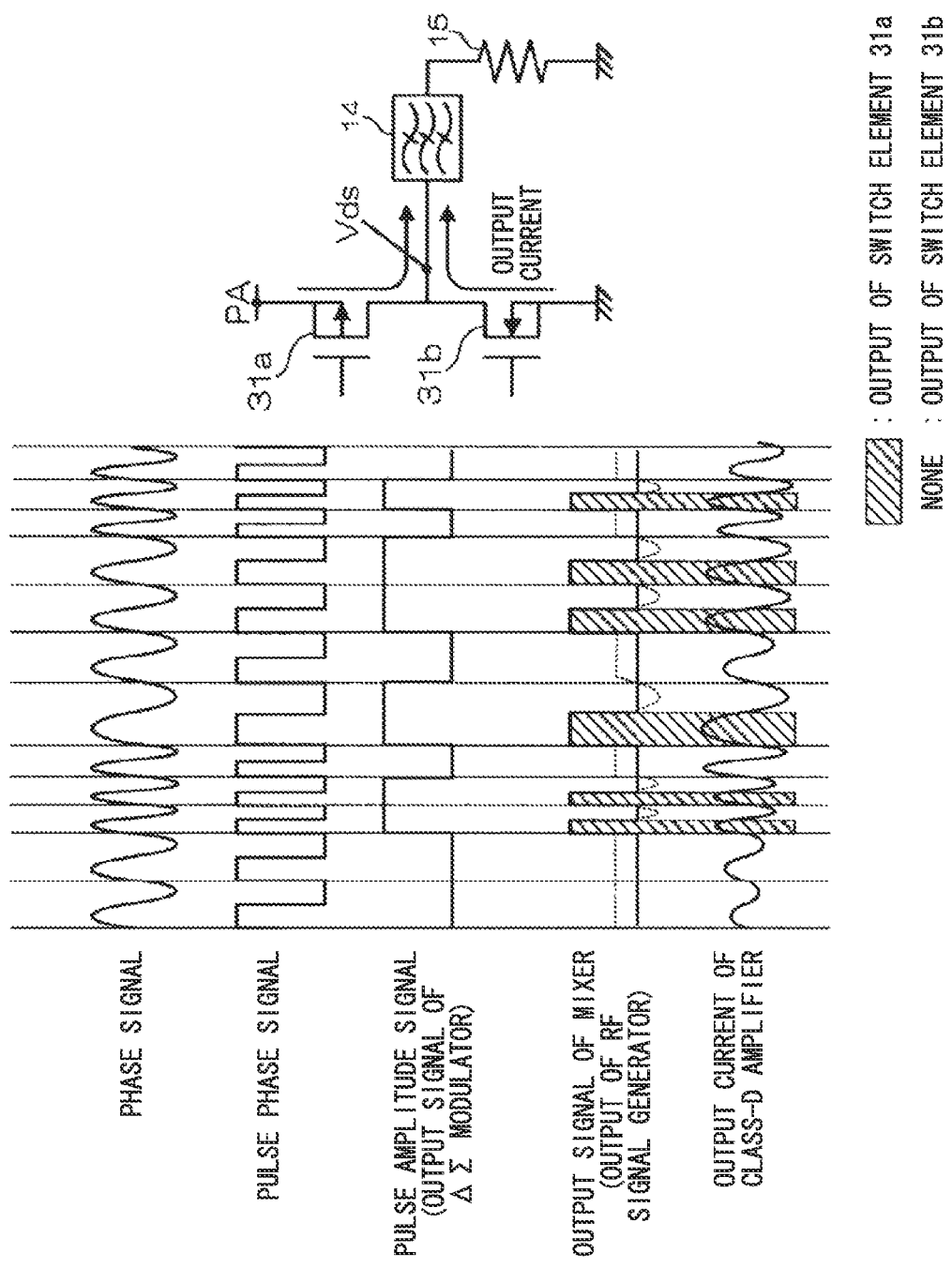
FIG. 2 A timing chart illustrating the operation of the wireless transmitter of the first embodiment.

FIG. 2 is a timing chart showing an internal signal and an output signal of the RF signal generation circuit 11, and an output signal of the class-D amplifier 13. Specifically, it shows a phase signal θ output from the amplitude-phase detector 22, a pulse phase signal output from the pulse phase signal generator 23, a pulse amplitude signal output from the sigma-delta modulator 24, an output signal of the mixer 25, and an output signal of the class-D amplifier 13.

In the output signal of the mixer 25, i.e. an output pulse signal of the RF signal generation circuit 11, a state transition point (i.e. a leading edge, a trailing edge) matches a state transition point of a pulse phase signal. Since the leading edge and the trailing edge of a pulse phase signal match 0° and 180° of a phase signal θ, the leading edge and the trailing edge of an output pulse signal of the RF signal generation circuit 11 match the phases of 0° and 180° of a RF signal.

As shown in FIG. 2, the D-class amplifier 13 produces an output signal which is a pulse voltage signal with the same pulse waveform as an input signal thereof. The filter circuit 14 employs impedance between the input and output terminals thereof, which is sufficiently smaller than the load 15 in a frequency band occupied by an RF signal but which is sufficiently larger than the load 15 in other frequency bands.

A current of the D-class amplifier 13 supplied to the filter circuit 14 is approximately set to a value resulting from an RF signal component, included in a pulse voltage signal at the output terminal of the D-class amplifier 13, divided by the resistance of the load 15. That is, the waveform of a current which is supplied from the D-class amplifier 13 to the filter circuit 14 is equivalent to the waveform of an RF signal. In other words, the phase of an output current of the D-class amplifier 13 matches the phase of an RF signal.

Considering that an ON/OFF transition point appeared in the switch elements 31a, 31b forming the D-class amplifier 13 matches a stage transition point of an output pulse signal of the RF signal generation circuit 11, the phase of an output current of the D-class amplifier 13 is either 0° or 180° at an ON/OFF transition point appeared in the switch elements 31a, 31b. That is, the output current instantly is decreased to zero at an ON/OFF transition point appeared in the switch elements 31a, 31b.

Therefore, the first embodiment of the present invention is designed such that the output current of the D-class amplifier 13 is decreased to zero at an ON/OFF transition point appeared in the switch elements 31a, 31b, thus minimizing an I-V overlap. That is, it is possible to suppress power consumption of the D-class amplifier 13 to be lower than that of NPL 1.

Figure 3:
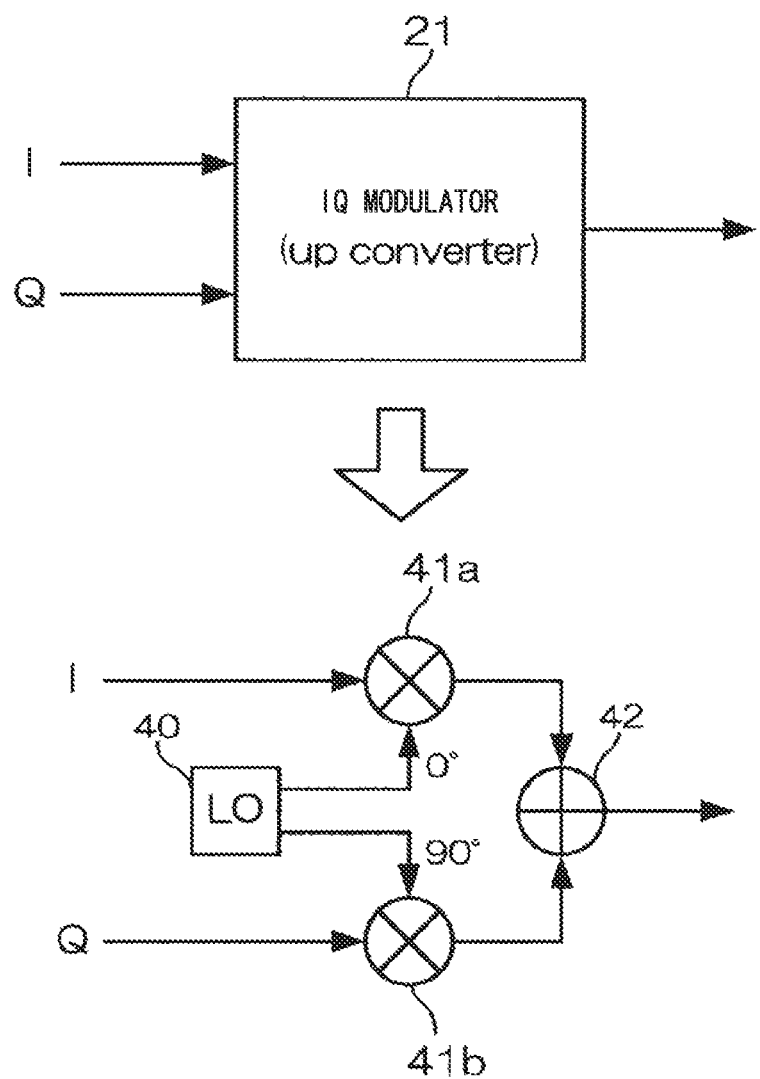
FIG. 3 A circuit diagram showing the constitution of an IQ modulator included in an RF signal generation circuit in the wireless transmitter of the first embodiment.

FIG. 3 is a circuit diagram showing the constitution of the IQ modulator 21 of the RF signal generation circuit 11. The IQ modulator 21 includes an IQ local oscillator 40, mixers 41a, 41b, and an adder 42. The IQ local oscillator 40 produces two sine-wave voltage signals with the same frequency as the carrier frequency of an RF signal and with a phase difference of 90° therebetween.

Each of the mixers 41a, 41b outputs a product of two input signals thereof. The mixer 41a receives a baseband signal I and a sine-wave signal (phase 0°) generated by the IQ local oscillator 40. The mixer 41b receives a baseband signal Q and another sine-wave signal generated by the IQ local oscillator 40 (i.e. a sine-wave signal whose phase is delayed by 90° compared to a sine-wave signal input to the mixer 41a). The adder 42 produces the sum of the output signals of the mixers 41a, 41b.

The IQ local oscillator 40 produces two sine-wave signals, i.e. voltage signals Vlo_i, Vlo_q, which are given by Equation 1, Equation 2.

$$Vlo\_i = A \cos(\Omega_c t) \qquad \text{[Equation 1]}$$

$$Vlo\_q = A \sin(\omega_c t) \qquad \text{[Equation 2]}$$

In Equation 1 and Equation 2, $\omega_c$ denotes an angular frequency equivalent to the carrier frequency.

The baseband signals input to the mixers 41a, 41b, i.e. Vbb_i, Vbb_q, are given by Equation 3 and Equation 4.

$$Vbb\_i = B \cos(\omega_b t + \theta) \qquad \text{[Equation 3]}$$

$$Vbb\_q = -B \sin(\omega_b t + \theta) \qquad \text{[Equation 4]}$$

In Equation 3 and Equation 4, B denotes amplitude information, and θ denotes phase information. Additionally, ωb denotes an angular frequency equivalent to an intermediate frequency.

The mixers 41a and 41b output the product of Vlo_i, Vbb_i and the product of Vol_q, Vbb_q. The output voltage signals of the mixers 41a, 41b, i.e. Vmix1, Vmix2, are given by Equation 5 and Equation 6.

$$Vmix1 = 0.5 \times AB \{ \cos((\omega_c + \omega_b)t + \theta) + \cos((\omega_c - \omega_b)t - \theta) \} \qquad \text{[Equation 5]}$$

$$Vmix2 = 0.5 \times AB \{ \cos((\omega_c + \omega_b)t + \theta) - \cos((\omega_c - \omega_b)t - \theta) \} \qquad \text{[Equation 6]}$$

The adder 42 produces the sum of the output signals of the mixers 41a, 41b, i.e. the sum of Vmix1 and Vmix2. The output voltage signal of the adder 42, i.e. Vcomb, is given by Equation 7.

$$Vcomb = AB \cos((\omega_c + \omega_b)t + \theta) \qquad \text{[Equation 7]}$$

The output voltage signal Vcomb of the adder 42 is equivalent to a baseband signal whose angular frequency is increased by $\omega_c$, i.e. an RF signal.

Figure 4:
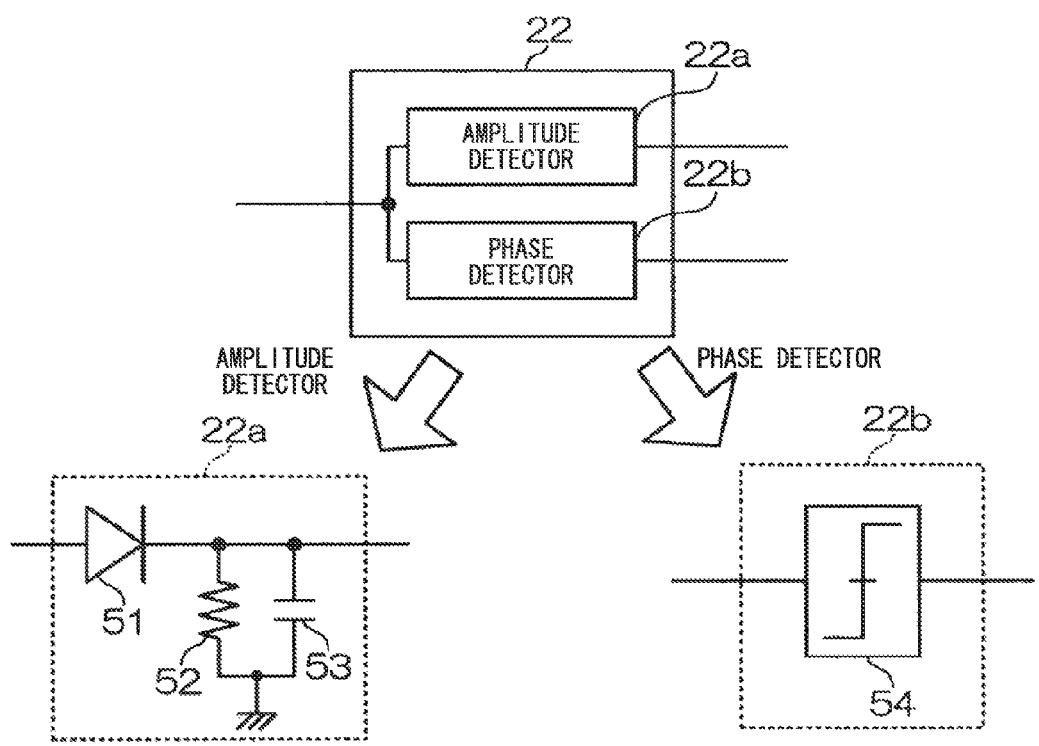
FIG. 4 A block diagram showing the constitution of an amplitude-phase detector included in the RF signal generation circuit of the wireless transmitter of the first embodiment.

FIG. 4 is a block diagram showing the constitution of the amplitude-phase detector 22 in the wireless transmitter 10 of the first embodiment. The amplitude-phase detector 22 includes an amplitude detector 22a and a phase detector 22b. The amplitude detector 22a includes a diode 51, a resistor 52, and a capacitance (a capacitor) 53. The diode 51 outputs a current in proportion to the square of an input voltage thereof. As an RF signal input to the diode 51 increases its amplitude, an output current of the diode 51 increases its time average.

The resistor 52 and the capacitance 53, which are connected to the subsequent stage of the diode 51, form a filter circuit which solely extracts a DC component from the output current of the diode 51. The DC component is equal to the time average of the output current of the diode 51. Therefore, as an RF signal increases its amplitude, the DC component increases its value. In other words, the monotonously increasing relationship is established between the amplitude of an RF signal input to the diode 51 and the DC component of the output current of the diode 51, wherein they hold one-to-one correspondence therebetween. For this reason, it is possible to extract amplitude information, included in an RF signal, from the DC component of the output signal of the diode 51.

The phase detector 22b includes a comparator 54. The output level of the comparator 54 becomes High in response to an input signal having a positive value but becomes Low in response to an input signal having a negative value. An RF signal indicates a positive value in response to a phase ranging from 0° to 180° but indicates a negative value in response to a phase ranging from 180° to 360°. Therefore, upon receiving an RF signal, the comparator 54 outputs a High level in response to the phase ranging from 0° to 180° but outputs a Low level in response to the phase ranging from 180° to 360°.

Ideally, the comparator 54 produces a rectangular waveform as its output waveform. Actually, due to the presence of parasitic resistance and capacitance in the output part of the comparator 54, the output waveform of the comparator 54 may be degraded to resemble a sine waveform. The pulse phase signal generator 23, connected to the subsequent stage of the phase detector 22b, reshapes a phase signal, resembling a sine waveform, into a rectangular waveform signal. Similar to the phase detector 22b, the pulse phase signal generator 23 can be configured of a comparator. In order to prevent the situation in which a rectangular waveform is reverted to a sine waveform due to parasitic parameters, however, a high-gain amplifier should be connected to the output part of a comparator so as to steepen an incline of a waveform at the phases of 0° and 180°, thus approximating the output waveform of a comparator to a rectangular waveform.

Figure 5:
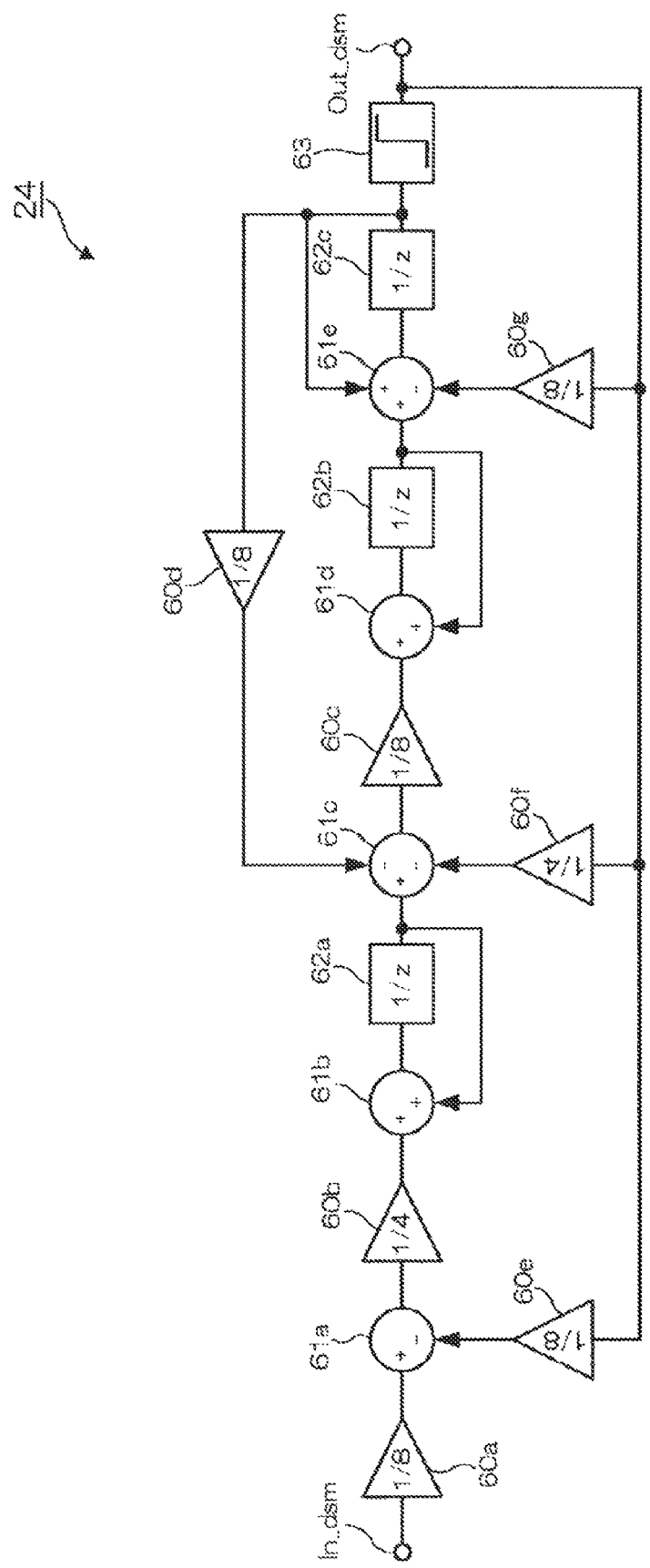
FIG. 5 A circuit diagram showing the constitution of a sigma-delta modulator included in the RF signal generation circuit of the wireless transmitter of the first embodiment.

FIG. 5 is a circuit diagram showing the constitution of the sigma-delta modulator 24 in the wireless transmitter 10 of the first embodiment.

The sigma-delta modulator 24 operates based on a high clock frequency higher than a clock frequency of an input signal thereof, thus converting multi-bit information, represented by an input signal, into one-bit information. Additionally, the sigma-delta modulator 24 may cause quantization noise which becomes highest at a Nyquist frequency but tends to decrease as frequency decreases.

It is possible to confine an input signal into a frequency range which is sufficiently lower than the Nyquist frequency when the sigma-delta modulator 24 operates based on a high clock frequency sufficiently higher than a clock frequency of an input signal thereof. An input signal may be hardly affected by quantization noise when the sigma-delta modulator 24 operates based on a high clock frequency.

The sigma-delta modulator 24 includes multipliers 60a to 60g, adders 61a to 61e, dividers 62a to 62c, and a 1-bit comparator 63. An input signal X(z) and an output signal Y(z) of the sigma-delta modulator 24 as well as quantization noise N(z) caused by the 1-bit comparator 63 can be defined according to Equation 8. Herein, $z=e^{(j\omega)}$, where $\omega$ denotes an angular frequency.

$$Y(z) = \frac{X(z) + N(z)(-257 + 769z - 768z^2 + 256z^3)}{-232 + 713z - 736z^2 + 256z^3} \quad \text{[Equation 8]}$$

In the case of DC (i.e. zero frequency) where $z=1$, the quantization noise N(z) is zero; the denominator of Equation 8 is 1; hence, the output signal Y(z) is equal to the input signal X(z). This indicates that, in the case of DC, quantization noise does not at all affect the output signal Y(z) of the sigma-delta modulator 24.

Figure 6:
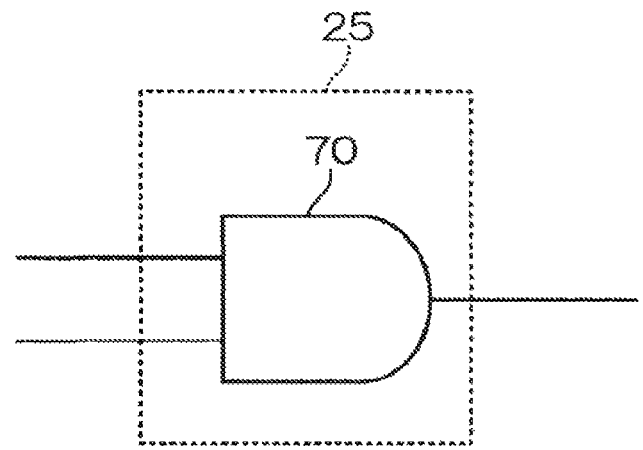
FIG. 6 A circuit diagram showing the constitution of a mixer included in the RF signal generation circuit of the wireless transmitter of the first embodiment.

FIG. 6 is a circuit diagram showing the constitution of the mixer 25 included in the RF signal generation circuit 11 of the wireless transmitter 10 of the first embodiment.

The mixer 25 is a logic element, which can be formed using a single AND element 70. The AND element 70 has two inputs and one output, wherein the output becomes High only when both inputs are High, while the output becomes Low when both inputs are Low. The AND element 70 forming the mixer 25 receives an output signal of the pulse phase signal generator 23 and an output signal of the sigma-delta modulator 24. Herein, the AND element 70 directly outputs the output signal of the pulse phase signal generator 23 when the output level of the sigma-delta modulator 24 is High. In contrast, the output of the AND element 70 turns to Low when the output level of the sigma-delta modulator 24 is Low.

Figure 7:
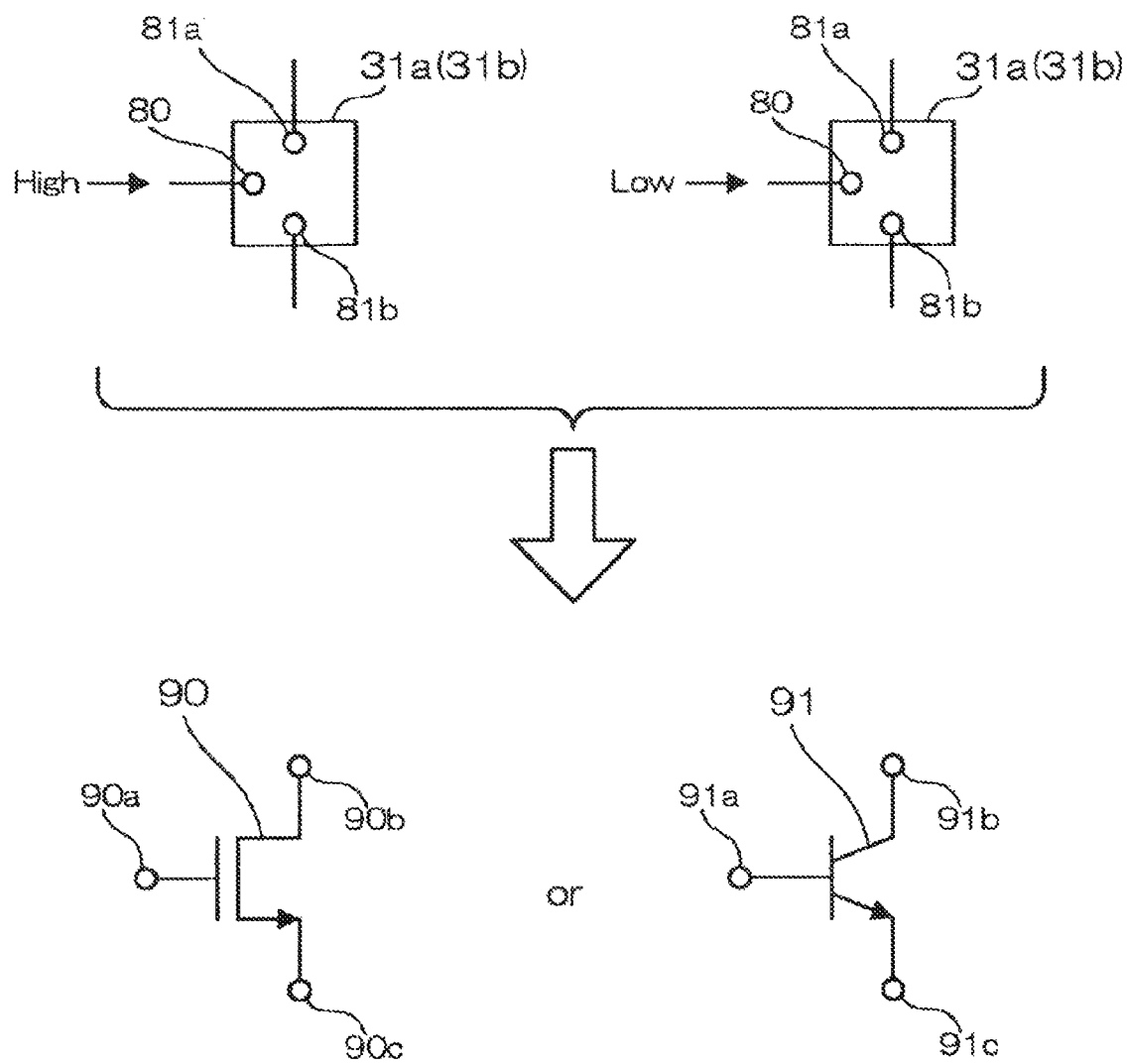
FIG. 7 A circuit diagram showing the constitution of the D-class amplifier in the wireless transmitter of the first embodiment.

FIG. 7 is a circuit diagram showing the constitution of the class-D amplifier 13 in the wireless transmitter 10 of the first embodiment, wherein it shows the specific constitution regarding the switch elements 31a, 31b.

As shown in FIG. 1, the class-D amplifier 13 includes the two switches 31a, 31b which are connected in series. As shown in FIG. 7, each of the switches 31a, 31b has a control terminal 80, and signal terminals 81a, 81b. A High input to the control terminal 80 causes short-circuiting between the signal terminals 81a and 81b so as to realize the ON state, while a Low input to the control terminal 80 causes disconnection between the signal terminals 81a and 81b so as to realize the OFF state.

The switch elements 31a, 31b can each be formed using a MOS transistor 90 or a bipolar transistor 91. Herein, the control terminal 80 corresponds to a gate 90a or a base 91a; the signal terminal 81a corresponds to a source 90b or an emitter 91b; the signal terminal 81b corresponds to a drain 90c or a collector 91c.

Figure 8:
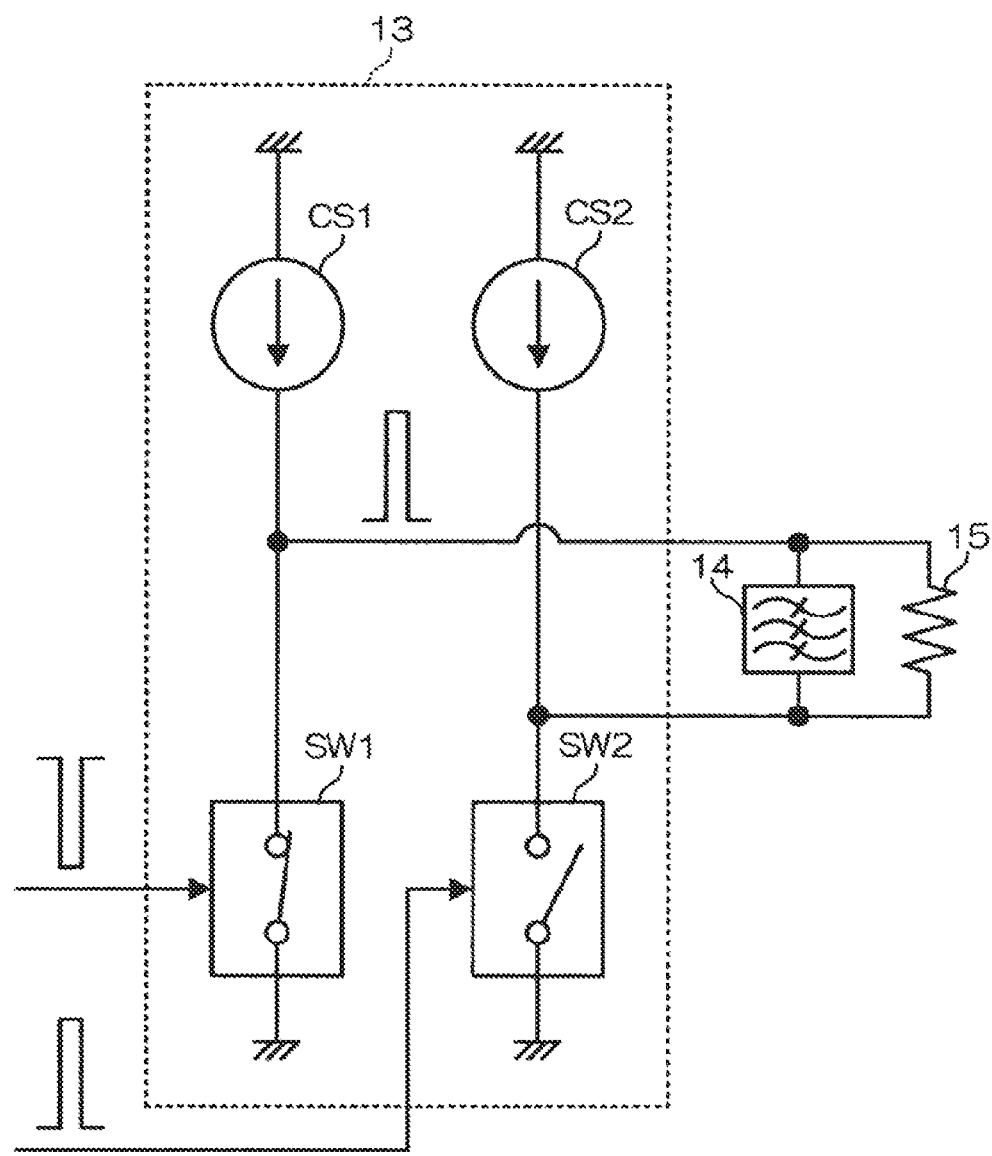
FIG. 8 A circuit diagram showing another constitution of a D-class amplifier.

FIG. 8 is a circuit diagram showing another constitution of the class-D amplifier 13.

As the constitution of the class-D amplifier 13, it is possible to employ the constitution shown in FIG. 8 other than the constitution shown in FIG. 1. In FIG. 8, the class-D amplifier 13 includes two switch elements SW1, SW2 and two current sources CS1, CS2. In this connection, the switch elements SW1, SW2 can be each formed using the MOS transistor 90 or the bipolar transistor 91 shown in FIG. 7.

In FIG. 8, when the left switch element SW1 is turned off while the right switch element SW2 is turned on, an output current of the left current source CS1 is outputted externally of the class-D amplifier 13 and then flows into the right switch element SW2 via the filter circuit 14 and the load 15. On the other hand, an output current of the right current source CS2 flows into the right switch element SW2 and thus is not supplied to the filter circuit 14 and the load 15.

In contrast, when the left switch element SW1 is turned on while the right switch element SW2 is turned off, an output current of the right current source CS2 flows into the left switch element SW1 via the filter circuit 14 and the load 15. The switch elements SW1 and SW2 are alternately turned on or off in response to a pulse signal and its complementary signal input thereto, thus causing a current pulse to flow through the load 15 in a positive direction or a negative direction in response to High or Low of each pulse. The filter circuit 14 disengages connection between its input and output terminals with respect to a frequency band occupied by an RF signal, but it establishes short-circuiting between its input and output terminals with respect to a frequency range outside the frequency band of an RF signal. Therefore, a voltage signal appearing between the opposite ends of the load 15 solely reflects an RF signal included in an input pulse signal.

The first embodiment is designed such that the sigma-delta modulator 24 modulates an amplitude signal output from the amplitude-phase detector 22 in synchronism with a pulse phase signal output from the pulse phase signal generator 23; therefore, it is possible to reduce an overlap between a current and a voltage, applied between terminals, in response to an open/close operation of each switch element (31a, 31b; SW1, SW2), thus reducing thermal loss which occurs in each switch element. Thus, it is possible to achieve a good noise characteristic and a good distortion characteristic with the class-D amplifier 13, thus achieving high power efficiency.

Second Embodiment

Next, a second embodiment of the present invention will be described.

Figure 9:
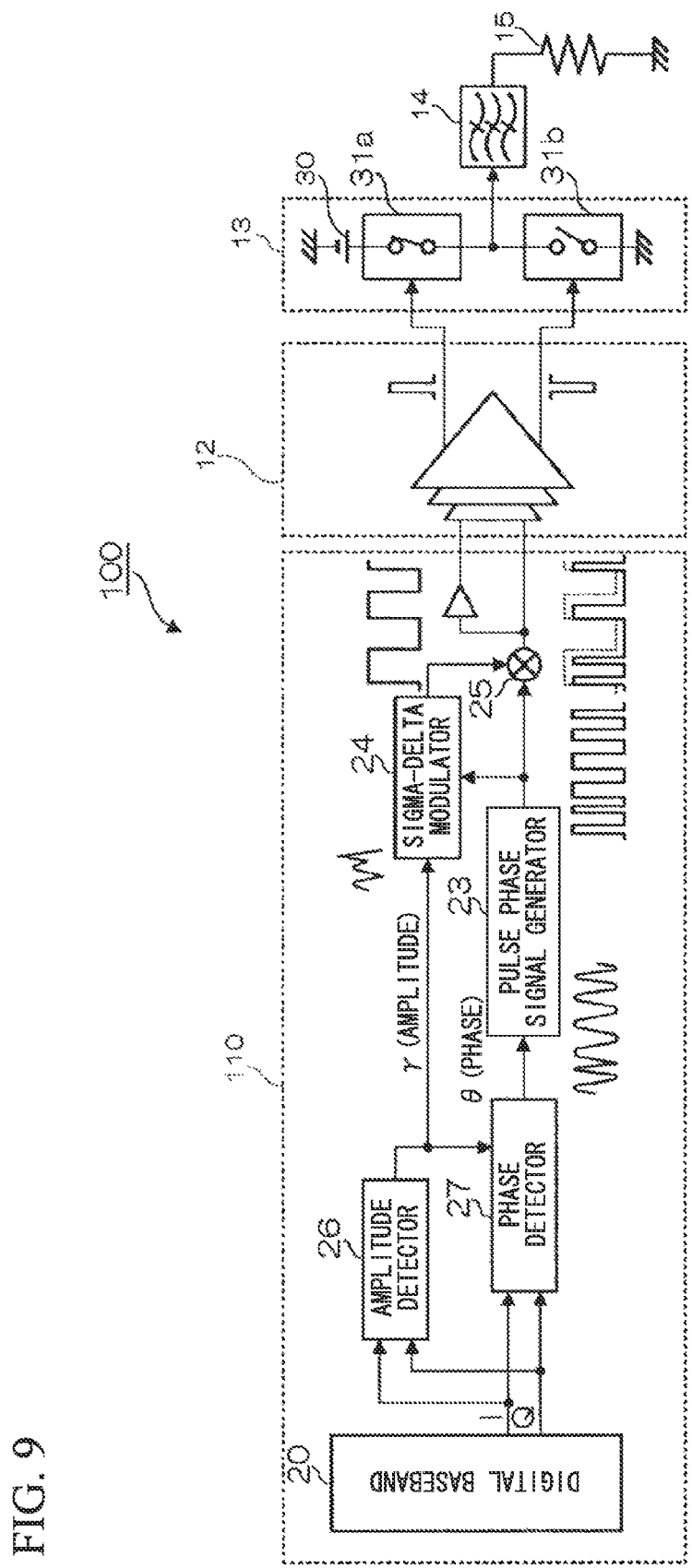
FIG. 9 A block diagram showing the constitution of a wireless transmitter according to a second embodiment of the present invention.

FIG. 9 is a block diagram showing the constitution of a wireless transmitter 100 according to a second embodiment of the present invention. In FIG. 9, the constituent parts identical to those shown in FIG. 1 are denoted using the same reference signs; thus, their descriptions will be omitted. Compared to the wireless transmitter 10 of the first embodiment, the wireless transmitter 100 of the second embodiment replaces the RF signal generation circuit 11 with an RF signal generation circuit 110. The RF signal generation circuit 110 has the same function as the RF signal generation circuit 11; but it carries out a different signal generating process. The following description refers to the constitution and the operation of the RF signal generation circuit 110.

In FIG. 9, the RF signal generation circuit 110 includes the digital baseband 20, an amplitude detector 26, a phase detector 27, the pulse phase signal generator 23, the sigma-delta modulator 24, and the mixer 25. In this connection, the digital baseband 20, the pulse phase signal generator 23, the sigma-delta modulator 24, and the mixer 25 are identical to the foregoing constituent element of the RF signal generation circuit 11.

The digital baseband 20 generates a wireless signal (a baseband signal) which is sent to the amplitude detector 26 and the phase detector 27. The amplitude detector 26 calculates the sum square of a baseband signal (an IQ signal) output from the digital baseband 20, thus calculates an amplitude of an RF signal (i.e. an amplitude signal). The phase detector 27 generates a phase signal of an RF signal based on an IQ signal of the digital baseband 20 and an amplitude signal of the amplitude detector 26. The amplitude signal of the amplitude detector 26 and the phase signal of the phase detector 27 are equivalent to the amplitude signal γ and the phase signal θ output from the amplitude-phase detector 22. Similar to the first embodiment, the amplitude signal y and the phase signal θ are converted into an RF pulse signal by means of the pulse phase signal generator 23, the sigma-delta modulator 24, and the mixer 25, so that the RF signal generation circuit 110 outputs the RF pulse signal.

Figure 10:
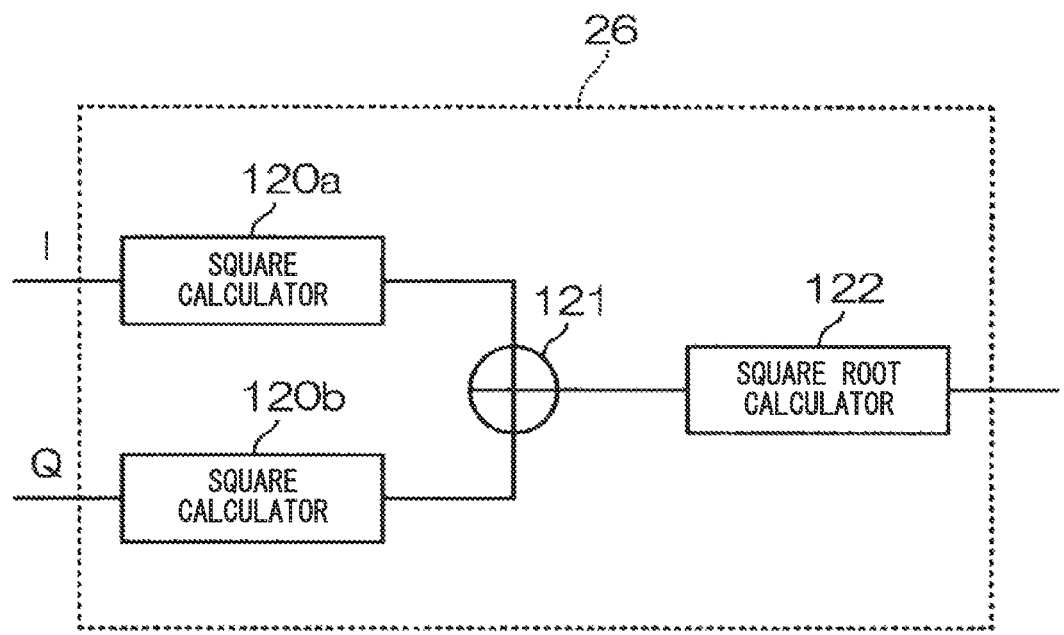
FIG. 10 A block diagram showing the constitution of an amplitude detector included in an RF signal generation circuit in the wireless transmitter of the second embodiment.

FIG. 10 is a block diagram showing the constitution of the amplitude detector 26 included in the RF signal generation circuit 110 of the wireless transmitter 100. The amplitude detector 26 includes two square calculators 120a, 120b, one adder 121, and one square-root calculator 122. The square calculators 120a, 120b calculate the square of their input signals (i.e. an I signal and a Q signal). The adder 121 calculates the sum of output signals of the square calculators 120a, 120b (i.e. the square of an I signal and the square of a Q signal). The square-root calculator 122 calculates the square root of the addition result of the adder 121. Herein, I and Q signals have the same amplitude, but they are orthogonal to each other with a phase difference of 90° therebetween. Therefore, the amplitude of an IQ signal can be produced by calculating the square root of the square sum. Additionally, the amplitude of an IQ signal is identical to the amplitude of an RF signal; therefore, it is possible to obtain the amplitude of an RF signal by applying an IQ signal to the amplitude detector 26.

Figure 11:
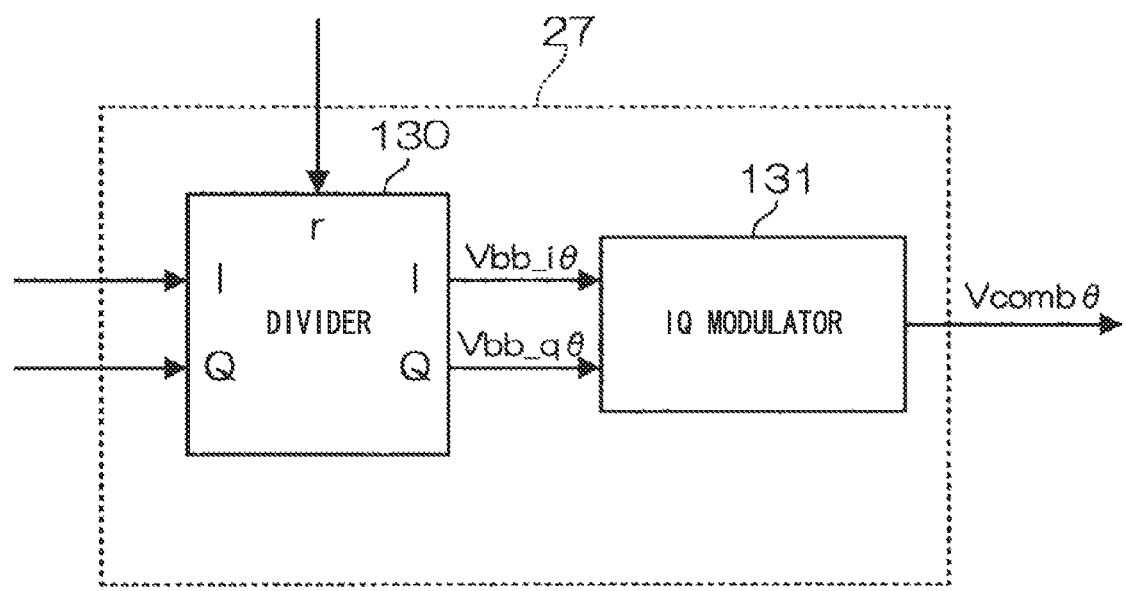
FIG. 11 A block diagram showing the constitution of a phase detector included in the RF signal generation circuit of the wireless transmitter of the second embodiment.

FIG. 11 is a block diagram showing the constitution of the phase detector 27 included in the RF signal generation circuit 110 of the wireless transmitter 100. The phase detector 27 includes a divider 130 and an IQ modulator 131. The IQ modulator 131 is equivalent to the IQ modulator 21 shown in FIG. 3. The divider 130 has an I input terminal (Iin), a Q input terminal (Qin), an r input terminal (rin), an I output terminal (Tout), and a Q output terminal (Qout). The divider 130 divides voltage signals (an I signal and a Q signal), input to the I input terminal and the Q input terminal, by a voltage signal ($\sqrt{}$ (square of I signal+square of Q signal)=amplitude), input to the r input terminal, thus producing the results from the I output terminal and the Q output terminal.

A digital baseband signal (i.e. an IQ signal), given by Equation 3 and Equation 4, are applied to the I input terminal and the Q input terminal of the divider 130, while an amplitude signal (i.e. an output signal of the amplitude detector 26 inputting a digital baseband signal (an IQ signal)) is applied to the r input terminal. In this case, the divider 130 produces output signals Vbb_iθ, Vbb_qθ, at the I output terminal and the Q output terminal thereof, which are given by Equation 9 and Equation 10 as a cosine-wave signal and a sine-wave signal with an amplitude of 1.

$Vbb\_i\theta = \cos(\omega_b t + \theta)$ [Equation 9]

$Vbb\_q\theta = -\sin(\omega_b t + \theta)$ [Equation 10]

In this connection, Vbb_iθ, Vbb_qθ given by Equation 9 and Equation 10 are equivalent to Vbb_i, Vbb_q given by Equation 3 and Equation 4 substituting 1 for B in the right side of each equation.

Upon receiving the output signals Vbb_iθ, Vbb_qθ of the divider 130, the IQ modulator 131 produces an output signal Vcombθ given by Equation 11. In this connection, Vcombθ given by Equation 11 is equivalent to Vcomb given by Equation 7 substituting 1 for B in the right side of an equation.

$Vcomb\theta = A\cos((\omega_c + \omega_b)t + \theta)$ [Equation 11]

The right side of Equation 11 indicates that a phase signal remains but the amplitude information of an RF signal is eliminated. Therefore, the phase detector 27 outputs a phase signal.

As the class-D amplifier 13 for use in the wireless transmitter 100 of the second embodiment, it is possible to employ the constitution shown in FIG. 8 other than the constitution shown in FIG. 9.

The second embodiment is designed such that the sigma-delta modulator 24 modulates an amplitude signal of the amplitude detector 26 in synchronism with a pulse phase signal of the pulse phase signal generator 23; therefore, it is possible to reduce an overlap between a current and a voltage, applied between terminals, due to an open/close operation of each switch element (31a, 31b) of the class-D amplifier 13, thus reducing thermal loss caused by each switch element. Thus, it is possible to achieve a good noise characteristic and a good distortion characteristic with the class-D amplifier 13, thus achieving high power efficiency.

Third Embodiment

Next, a third embodiment of the present invention will be described.

Figure 12:
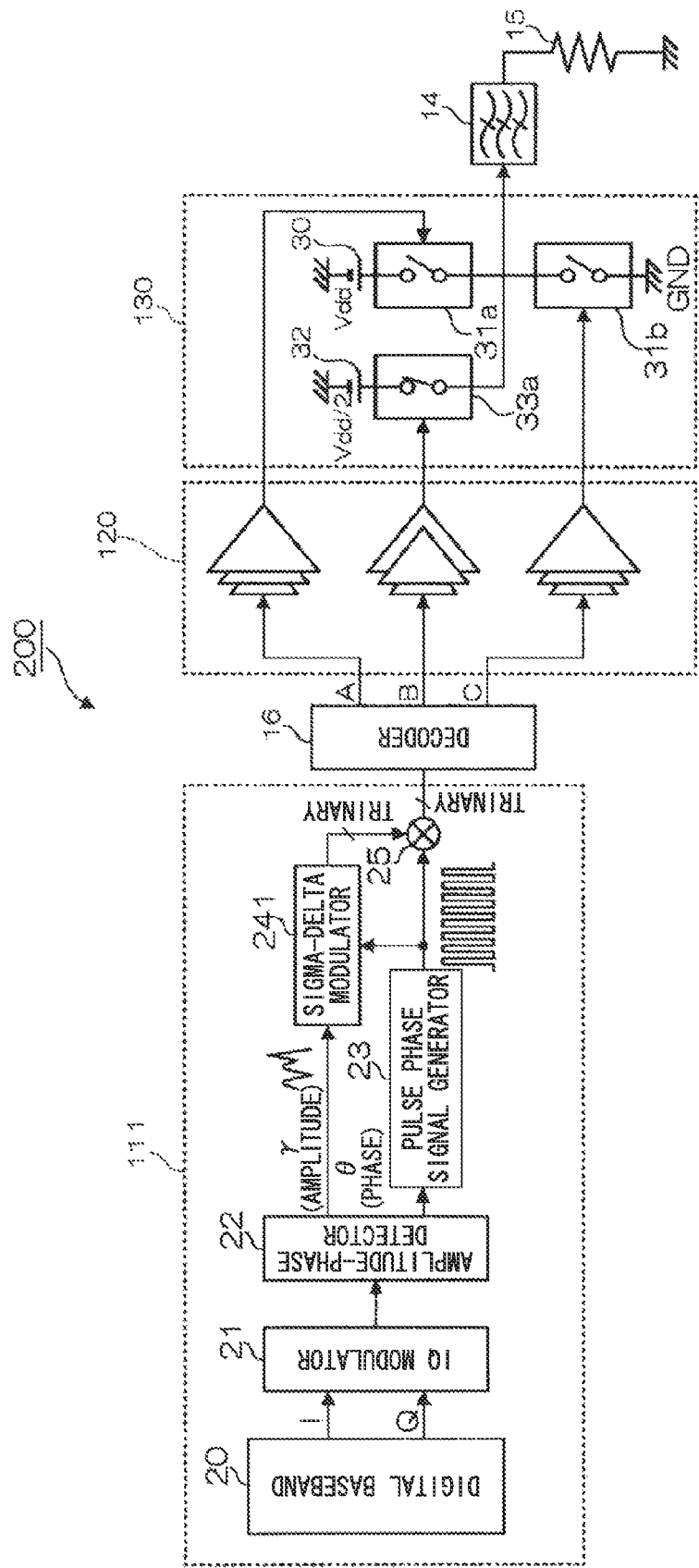
FIG. 12 A block diagram showing the constitution of a wireless transmitter according to a third embodiment of the present invention.

FIG. 12 is a block diagram showing the constitution of a wireless transmitter 200 according to a third embodiment of the present invention. In FIG. 12, the constituent elements identical to those shown in FIG. 1 are denoted using the same reference signs; hence, their descriptions will be omitted. Compared to the first embodiment shown in FIG. 1, the third embodiment replaces the RF signal generation circuit 11 with an RF signal generation circuit 111, replaces the driver amplifier 12 with a driver amplifier 120, and replaces the class-D amplifier 13 with a class-D amplifier 130. Additionally, a decoder is interposed between the RF signal generation circuit 111 and the driver amplifier 120. The RF signal generation circuit 111 replaces the sigma-delta modulator 24 of the RF signal generation circuit 11 with a sigma-delta modulator 241.

Figure 13:
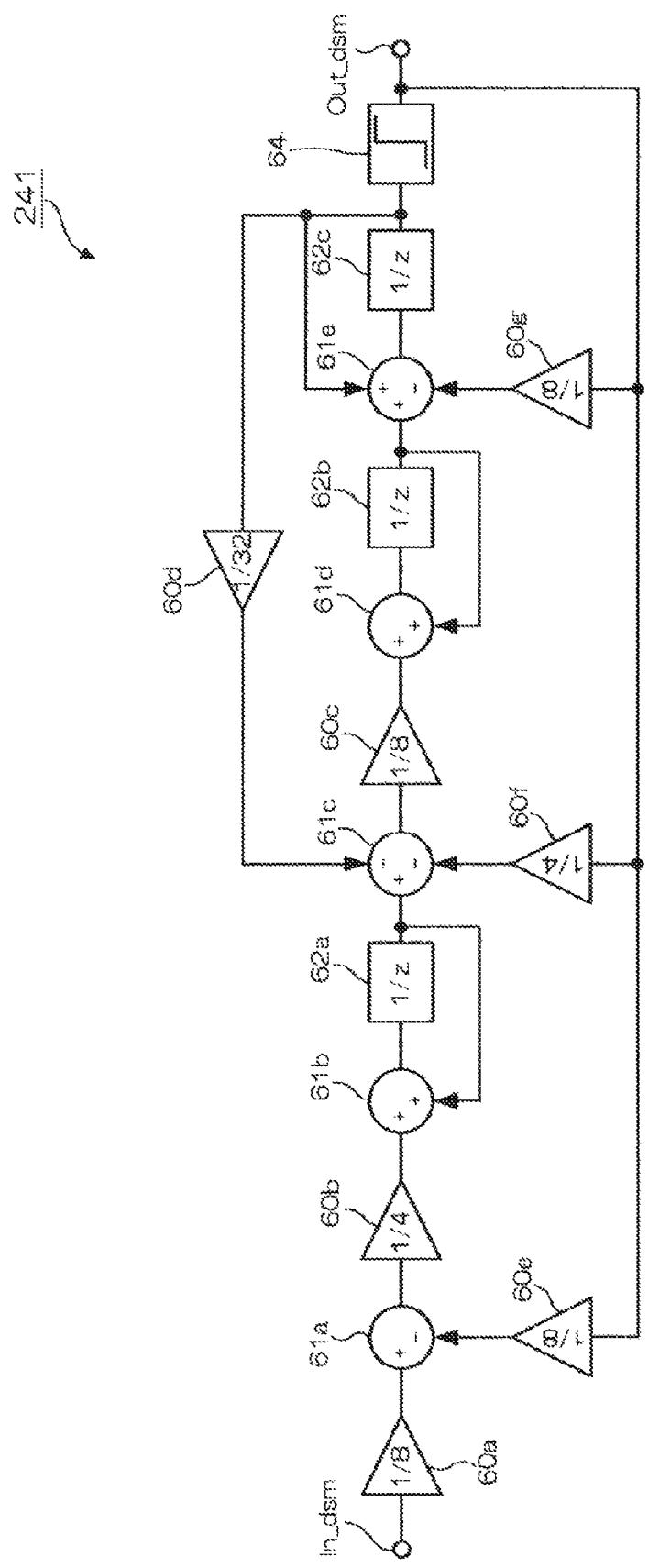
FIG. 13 A circuit diagram showing the constitution of a sigma-delta modulator included in the RF signal generation circuit of the wireless transmitter of the third embodiment.

FIG. 13 is a circuit diagram showing the constitution of the sigma-delta modulator 241 of the RF signal generation circuit 111. The sigma-delta modulator 241 replaces the 1-bit comparator 63 of the sigma-delta modulator 24 shown in FIG. 5 with a trinary-output comparator 64.

Figure 14:
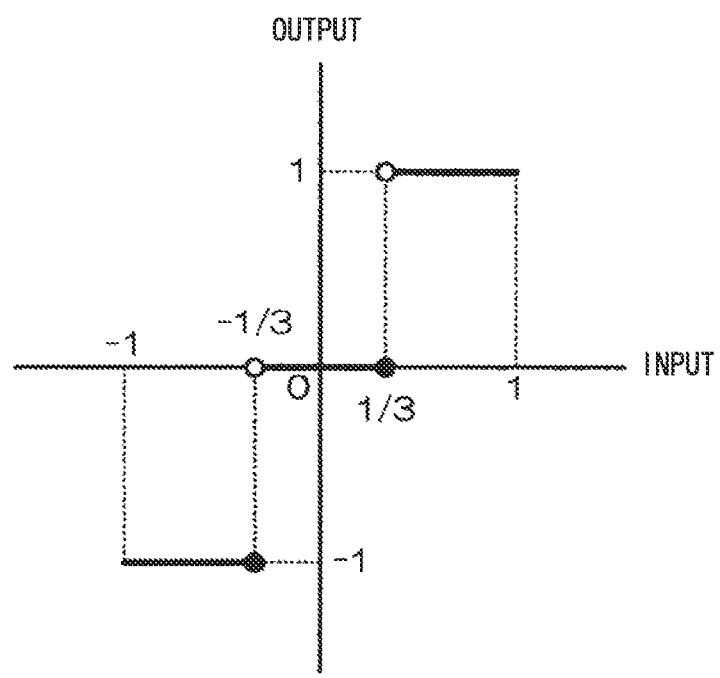
FIG. 14 A graph showing the input/output relationship between ternary-output comparators included in the sigma-delta modulator shown in FIG. 13.

FIG. 14 is a graph showing the input/output relationship of the trinary-output comparator 64 in the sigma-delta modulator 241. As shown in FIG. 14, the trinary-output comparator 64 utilizes two decision thresholds (−⅓, ⅓) with respect to an input value thereof, thus producing three output values (−1, 0, 1).

The mixer 25 of the RF signal generation circuit 111 mixes the output signal of the sigma-delta modulator 24 and the output signal of the pulse phase signal generator 23, thus outputting a mixed signal. In response to the output signal of the pulse phase signal generator 23 having two values (i.e. 0 or 1), the number of output values of the RF signal generation circuit 111 is identical to the number of output values of the sigma-delta modulator 241, i.e. three (−1, 0, 1).

In the wireless transmitter 200 of the third embodiment, the class-D amplifier 130 includes three switch elements 31a, 31b, 33a. The switch elements 31a, 31b, 33a have the same constitution as the switch elements 31a, 31b included in the class-D amplifier 13 shown in FIG. 1, wherein each switch element is turned on in response to a High input to its control terminal but is turned off in response to a Low input. The switch element 31a is connected to a power source 30 with a voltage value Vdd; the switch element 31b is connected to a ground GND; and the switch element 33a is connected to a power source 32 with a voltage value Vdd/2. Additionally, the switch elements 31a, 31b, 33a are mutually connected together to form an output terminal of the class-D amplifier 130.

Among the three switch elements 31a, 31b, 33a, only one switch element is normally set to High while the other two switch elements receive a Low input. The output terminal of the class-D amplifier 130 is connected to the switch element receiving a High input, thus outputting the voltage of its power source. That is, the output voltage value of the class-D amplifier 130 may correspond to one of three values, i.e. Vdd, Vdd/2, 0.

The decoder 16 produces control signals applied to the switch elements 31a, 31b, 33a constituting the class-D amplifier 130. Based on trinary values output from the RF signal generation circuit 111, the decoder 16 generates control signals A, B, C in accordance with a truth table shown in FIG. 15, thus supplying them to the switch elements 31a, 33a, 31b via the driver amplifier 120. That is, a High input is applied to the switch element 31a connected to Vdd in response to an output value 1 of the RF signal generation circuit 111; a High input is applied to the switch element 33a connected to Vdd/2 in response to an output value 0; and a High input is applied to the switch element 31b connected to the ground GND in response to an output value −1.

The trinary-output comparator 64 of the sigma-delta modulator 241 provides a large number of output values, compared to that of the 1-bit comparator 63; therefore, it may undergo statistically small quantization noise (i.e. a difference between an input signal and an output signal), compared to that of the 1-bit comparator 63. Therefore, the third embodiment may cause small quantization noise, which is smaller than quantization noise of the first embodiment, resulting in an improvement to a signal-to-noise power ratio (SNR) with respect to a wireless signal generated by the third embodiment compared to the first embodiment.

In the third embodiment, both the number of output values of the RF signal generation circuit 111 and the number of output voltage values of the class-D amplifier 130 are "3"; however, this number can be increased to N equal to or higher than "3" or decreased to N equal to or less than "3". In this case, it is possible to reduce the amount of quantization noise, and it is therefore possible to further improve the SNR with respect to a wireless signal generated by the third embodiment.

In the third embodiment, the sigma-delta modulator 241 included in the RF signal generation circuit 111 can be changed with an N-value output type. In the N-value output type of the sigma-delta modulator 241, its output values are sorted in ascending order, that is, a(1), a(2), . . . , a(N) where a(1)=0. It is possible to change the sigma-delta modulator 241 with the N-value output type by replacing the trinary-output comparator 64 with an N-value output type that produces N values based on N−1 thresholds. Additionally, the number of switch elements constituting the class-D amplifier 130 is changed to N so that power-source voltages connected to switch elements are sorted in an ascending order as V(1), V(2), . . . , V(N) where V(1)=0.

In response to an output value a(m) of the RF signal generation circuit 111 (where m is an integer ranging from 1 to N), the decoder 16 generates a control signal that applies a High input solely to a switch element connected to the voltage value V(m). In this constitution, the class-D amplifier 130 outputs the voltage value V(m) in response to the output value a(m) of the RF signal generation circuit 111. As described above, it is possible to increase both the number of output values of the RF signal generation circuit 111 and the number of voltage values of the class-D amplifier 130 with N. In order to reduce a signal distortion, it is necessary to set the same ratio of an interval to a full scale in accordance with Equation 12 wherein each interval lies between adjoining output values of the RF signal generation circuit 111 or between adjoining output values of the class-D amplifier 130.

$$\frac{a(k) - a(k-1)}{a(N) - a(1)} = \frac{V(k) - V(k-1)}{V(N) - V(1)} \qquad \text{[Equation 12]}$$

Fourth Embodiment

Next, a fourth embodiment of the present invention will be described.

Figure 16:
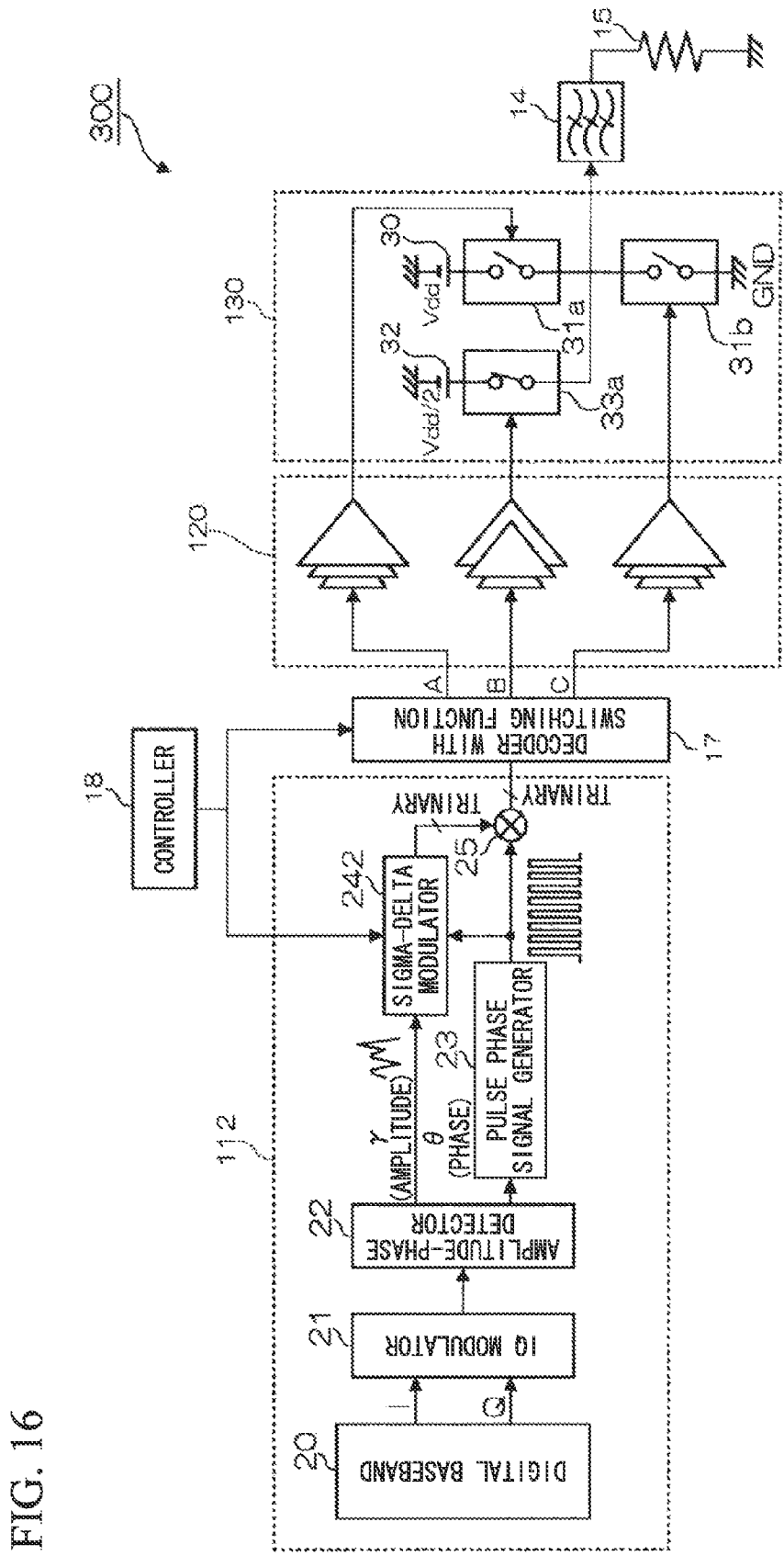
FIG. 16 A block diagram showing the constitution of a wireless transmitter according to a fourth embodiment of the present invention.

FIG. 16 is a block diagram showing the constitution of a wireless transmitter 300 according to a fourth embodiment of the present invention. In FIG. 16, the constituent parts identical to those of FIG. 12 are denoted using the same reference signs; hence, their descriptions will be omitted. Compared to the wireless transmitter 200 of the third embodiment, the wireless transmitter of the fourth embodiment replaces the RF signal generation circuit 111 with an RF signal generation circuit 112 and replaces the decoder 16 with a decoder 17 with a switching function. Additionally, the wireless transmitter 300 is equipped with a controller 18 that changes internal parameters of the decoder 17 with a switching function. Compared to the RF signal generation circuit 111, the RF signal generation circuit 112 replaces the sigma-delta modulator 241 with a sigma-delta modulator 242.

Figure 17:
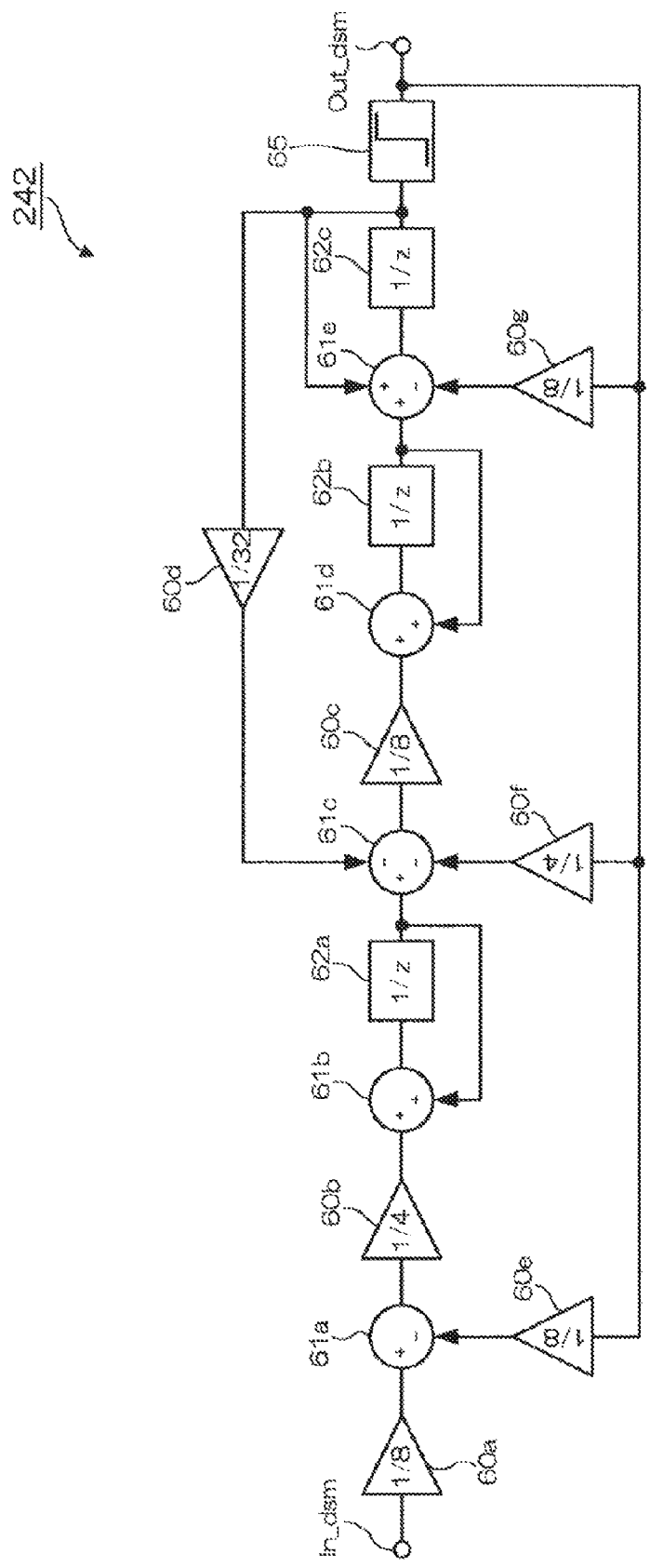
FIG. 17 A circuit diagram showing the constitution of a sigma-delta modulator include in an RF signal generation circuit in the wireless transmitter of the fourth embodiment.

FIG. 17 is a circuit diagram showing the constitution of the sigma-delta modulator 242 included in the wireless transmitter 300 of the fourth embodiment. The sigma-delta modulator 242 has the constitution replacing the trinary-output comparator 64, included in the sigma-delta modulator 241 shown in FIG. 13, with a comparator 65 with a switching function.

The comparator 65 with a switching function changes its function to realize either the 1-bit comparator 63 shown in FIG. 5 or the trinary-output comparator 64 shown in FIG. 13 in response to an external control signal. Specifically, the comparator 65 with a switching function changes its function to realize the trinary-output comparator 64 in response to a control signal X input thereto, while the comparator 65 with a switching function changes its function to realize the 1-bit comparator 63 in response to a control signal Y.

Figures 18, 19:
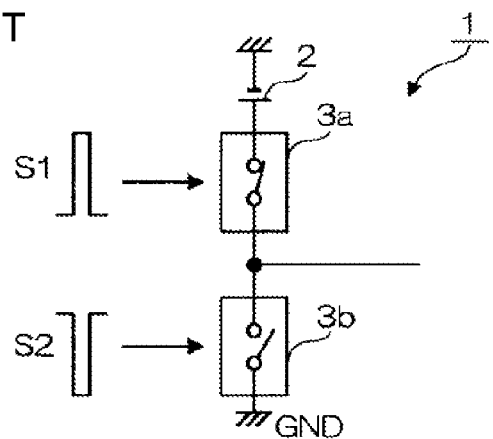
FIG. 18 Two types of truth tables applied to a decoder, with a switching function, in the wireless transmitter of the fourth embodiment.
FIG. 19 A circuit diagram showing the constitution of a D-class amplifier according to a conventional art.
Figure 20:
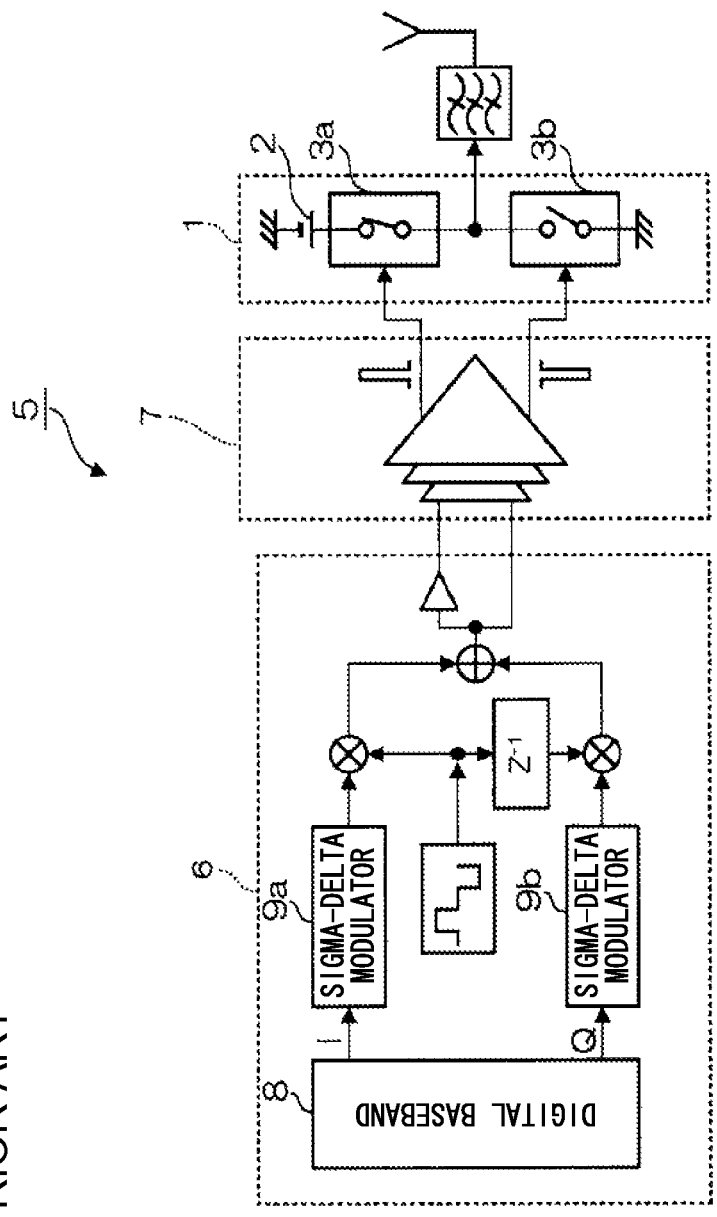
FIG. 20 A block diagram showing the constitution of a wireless transmitter using the D-class amplifier according to the conventional art.

The decoder 17 with a switching function involves two types of truth tables A, B shown in FIG. 18(a), (b), wherein it adopts the truth table A in response to the control signal X but it adopts the truth table B in response to the control signal Y. In this connection, the truth table A is identical to the truth table (see FIG. 15) applied to the decoder 16 of the wireless transmitter 200 of the third embodiment.

The controller 18 generates two types of signals X, Y serving as control signals applied to the comparator 65 with a switching function, included in the sigma-delta modulator 242, and the decoder 17 with a switching function. The comparator 65 with a switching function changes its function to realize the trinary output type in response to the control signal X output from the controller 18, whereby the RF signal generation circuit 112 of the fourth embodiment implements the same constitution as the RF signal generation circuit 111 of the third embodiment. In this case, the decoder 17 with a switching function utilizes the truth table A shown in FIG. 18(a), thus realizing the same function as the decoder 16. In response to the control signal X of the controller 18, the wireless transmitter 300 of the fourth embodiment realizes the same constitution as the wireless transmitter 200 of the third embodiment.

On the other hand, the comparator 65 with a switching function changes its function to realize the 1-bit type in response to the control signal Y of the controller 18. Additionally, the decoder 17 with a switching function utilizes the truth table B shown in FIG. 18(b). In this connection, both the number of output values of the RF signal generation circuit 12 and the number of voltage values of the class-D amplifier 130 are "3" in response to the control signal X, while both the number of output values and the number of voltage values becomes "2" in response to the control signal Y. That is, the control signal X, compared to the control signal Y, may reduce quantization noise so as to improve an SNR with regard to an output signal of the class-D amplifier 130.

Additionally, the number of output values of the comparator 65 with a switching function, included in the sigma-delta modulator 242, becomes "3" in response to the control signal X, while the number of output values becomes "2" in response to the control signal Y. The sigma-delta modulator 242 bears a smaller load of computational processing as the comparator 65 with a switching function produces a smaller output value. In terms of a limit value of operating speed of the sigma-delta modulator 242, a limit value SY ascribed to the control signal Y is higher than a limit value SX ascribed to the control signal X.

A clock signal applied to the sigma-delta modulator 242 is a pulse phase signal of the pulse phase signal generator 23 so that the velocity thereof may be close to that of a carrier frequency. That is, the controller 18 generates the control signal X when the velocity of a pulse phase signal is equal to or less than SX, while the controller 18 generates the control signal Y when the velocity of a pulse phase signal exceeds SX. Thus, it is possible to normally set an optimum value as an SNR of a wireless signal.

In this connection, it is possible to cope with the situation where a carrier frequency is dynamically fluctuating because the controller 18 outputs the control signal X when the velocity of a pulse phase signal is equal to or less than SX or the control signal Y when the velocity exceeds SX.

INDUSTRIAL APPLICABILITY

The present invention is applicable to wireless transmitters installed in communication devices such as cellular phones and wireless LANs and in particular to the constitution in which a class-D amplifier is driven using an output signal of an RF signal generation circuit. Additionally, it is possible to reduce thermal loss that occurs in switch elements included in a class-D amplifier; therefore, it is possible to achieve a good noise characteristic and a good distortion characteristic, and it is possible to achieve high power efficiency and thereby reduce power consumption of any communication device. Thus, the present invention exhibits high flexibility when applied to various types of communication devices.

REFERENCE SIGNS LIST 10 wireless transmitter
11 RF signal generation circuit
12, 120 driver amplifier
13, 130 class-D amplifier
14 filter circuit
15 load
16 decoder
17 decoder with a switching function
18 controller
20 digital baseband
21 IQ modulator
22 amplitude-phase detector
23 pulse phase signal generator
24, 241, 242 sigma-delta modulator
25 mixer
26 amplitude detector
27 phase detector
31a, 31b, 33a switch element
63 1-bit comparator
64 trinary-output comparator
65 comparator with a switching function
100, 200, 300 wireless transmitter
110, 111, 112 RF signal generation circuit

The invention claimed is:

1. A wireless transmitter using a class-D amplifier with a plurality of switching elements and a Radio Frequency (RF) signal generation circuit which generates RF pulse signals to drive the amplifier, comprising:
 a first orthogonal modulator that performs orthogonal modulation on a digital signal;
 an amplitude detector that detects an amplitude of an output signal of the first orthogonal modulator, thus outputting an amplitude signal;
 a phase detector that detects a phase of the output signal of the first orthogonal modulator, thus outputting a phase signal;
 a pulse phase signal generator that generates a pulse phase signal having a pulse waveform based on the phase signal;
 a sigma-delta modulator that performs sigma-delta modulation on the amplitude signal in synchronism with the pulse phase signal; and
 a mixer that mixes an output signal of the sigma-delta modulator with the pulse phase signal, thus generating the RF pulse signals which turn on one switching element and turn off all the other switching elements at the timing of the phase signal of one of 0 or 180 degree and minimize a current-voltage (IV) overlap due to switching operations of the plurality of switching elements, wherein the amplitude detector comprises:
a first square calculator that calculates the square of a common-mode signal derived from the digital signal;
a second square calculator that calculates the square of an orthogonal signal derived from the digital signal;
an adder that calculates the sum of the square calculated by the first square calculator and the square calculated by the second square calculator; and
a square root calculator that calculates the root of an addition result of the adder, and the phase detector comprises:
a divider that divides the common-mode signal and the orthogonal signal, derived from the digital signal, by the amplitude signal of the amplitude detector; and
a second orthogonal modulator that performs orthogonal modulation on an output signal of the divider,
wherein the pulse phase signal generator includes a comparator outputs a logical level representing the phase of the output signal.

2. The RF signal generation circuit according to claim 1, wherein the phase detector includes a comparator that outputs a logical level representing the phase of the output signal, and wherein the mixer includes an AND-gate element that calculates a logical product between the output signal of the sigma-delta modulator and the pulse phase signal.

3. A wireless transmitter using a class-D amplifier with a plurality of switching elements and a Radio Frequency (RF) signal generation circuit which generates RF pulse signals to drive the amplifier, comprising:
an amplitude detector that detects an amplitude of a digital signal so as to output an amplitude signal;
a phase detector that detects a phase of the digital signal so as to output a phase signal;
a pulse phase signal generator that generates a pulse phase signal having a pulse waveform based on the phase signal;
a sigma-delta modulator that performs sigma-delta modulation on the amplitude signal in synchronism with the pulse phase signal; and
a mixer that mixes an output signal of the sigma-delta modulator with the pulse phase signal so as to generate the RF pulse signals which turn on one switching element and turn off all the other switching elements at the timing of the phase signal of one of 0 or 180 degree and minimize a current-voltage (IV) overlap due to switching operations of the plurality of switching elements, wherein the amplitude detector comprises:
a first square calculator that calculates the square of a common-mode signal derived from the digital signal;
a second square calculator that calculates the square of an orthogonal signal derived from the digital signal;
an adder that calculates the sum of the square calculated by the first square calculator and the square calculated by the second square calculator; and
a square root calculator that calculates the root of an addition result of the adder, and the phase detector comprises:
a divider that divides the common-mode signal and the orthogonal signal, derived from the digital signal, by the amplitude signal of the amplitude detector; and
an orthogonal modulator that performs orthogonal modulation on an output signal of the divider,
wherein the pulse phase signal generator includes a comparator outputs a logical level representing the phase of the output signal.

4. A wireless transmitter that wirelessly transmits a digital signal using an amplifier including a plurality of switching elements, comprising:
an amplitude detector that detects an amplitude of a digital signal so as to output an amplitude signal;
a phase detector that detects a phase of the digital signal so as to output a phase signal;
a pulse phase signal generator that generates a pulse phase signal having a pulse waveform based on the phase signal;
a sigma-delta modulator that performs sigma-delta modulation on the amplitude signal in synchronism with the pulse phase signal; and
a mixer that mixes an output signal of the sigma-delta modulator with the pulse phase signal so as to generate an Radio Frequency (RF) pulse signal, thus minimizing a current-voltage (IV) overlap due to switching operations of the plurality of switching elements, wherein the amplitude detector comprises:
a first square calculator that calculates the square of a common-mode signal derived from the digital signal;
a second square calculator that calculates the square of an orthogonal signal derived from the digital signal;
an adder that calculates the sum of the square calculated by the first square calculator and the square calculated by the second square calculator; and
a square root calculator that calculates the root of an addition result of the adder, and the phase detector comprises:
a divider that divides the common-mode signal and the orthogonal signal, derived from the digital signal, by the amplitude signal of the amplitude detector; and
an orthogonal modulator that performs orthogonal modulation on an output signal of the divider,
wherein the pulse phase signal generator includes a comparator outputs a logical level representing the phase of the output signal.

5. A wireless transmission using a class-D amplifier with a plurality of switching elements and a Radio Frequency (RF) signal generation method which generates RF pulse signals to drive the amplifier, comprising:
performing orthogonal modulation on a digital signal;
detecting an amplitude of the digital signal subjected to orthogonal modulation, thus outputting an amplitude signal;
detecting a phase of the digital signal subjected to orthogonal modulation, thus outputting a phase signal;
generating a pulse phase signal having a pulse waveform based on the phase signal;
performing sigma-delta modulation on the amplitude signal in synchronism with the pulse phase signal; and
mixing the amplitude signal subjected to sigma-delta modulation with the pulse phase signal, thus generating the RF pulse signals which turn on one switching element and turn off all the other switching elements at the timing of the phase signal of one of 0 or 180 degree and minimize a current-voltage (IV) overlap due to switching operations of the plurality of switching elements, wherein detecting an amplitude comprises:
calculating the square of a common-mode signal derived from the digital signal;
calculating the square of an orthogonal signal derived from the digital signal;

calculating the sum of the square of a common-mode signal and the square calculated of an orthogonal signal; and calculating the root of the calculated sum, and detecting a phase comprises:

dividing the common-mode signal and the orthogonal derived from the digital signal, by the amplitude signal; and performing orthogonal modulation on an output signal obtained from dividing the common-mode signal and the orthogonal signal, outputting a logical level representing the phase of the output signal.

6. A wireless transmission using a class-D amplifier with a plurality of switching elements and a Radio Frequency (RF) signal generation method which generates RF pulse signals to drive the amplifier, comprising:

detecting an amplitude of the digital signal so as to output an amplitude signal;

detecting a phase of the digital signal so as to output a phase signal;

generating a pulse phase signal having a pulse waveform based on the phase signal;

performing sigma-delta modulation on the amplitude signal in synchronism with the pulse phase signal; and mixing the amplitude signal subjected to sigma-delta modulation with the pulse phase signal, thus generating the RF pulse signals which turn on one switching element and turn off all the other switching elements at the timing of the phase signal of one of 0 or 180 degree and minimize a current-voltage (IV) overlap due to switching operations of the plurality of switching elements, wherein detecting an amplitude comprises:

calculating the square of a common-mode signal derived from the digital signal;

calculating the square of an orthogonal signal derived from the digital signal;

calculating the sum of the square of a common-mode signal and the square calculated of an orthogonal signal; and calculating the root of the calculated sum, and detecting a phase comprises:

dividing the common-mode signal and the orthogonal signal derived from the digital signal, by the amplitude signal; and performing orthogonal modulation on an output signal obtained from dividing the common-mode signal and the orthogonal signal, outputting a logical level representing the phase of the output signal.

\* \* \* \* \*

UNITED STATES PATENT AND TRADEMARK OFFICE
CERTIFICATE OF CORRECTION

PATENT NO. : 9,166,539 B2
APPLICATION NO. : 13/517147
DATED : October 20, 2015
INVENTOR(S) : Shinichi Hori It is certified that error appears in the above-identified patent and that said Letters Patent is hereby corrected as shown below:

Specification

Column 8, Line 4: Delete "$Vlo\_i = A \cos(\Omega_c t)$" and insert -- $Vlo\_i = A \cos(\omega_c t)$ --, therefor.

Column 11, Line 65: Delete "(Tout)," and insert -- (Iout), --, therefor.

Claims

Column 19, Line 7: In Claim 5, before "derived" insert -- signal, --, therefor.

Column 20, Line 19: In Claim 6, delete "signal" and insert -- signal, --, therefor.

Signed and Sealed this
Fifteenth Day of March, 2016

Michelle K. Lee
*Director of the United States Patent and Trademark Office*